United States Patent
Seki

(10) Patent No.: US 8,129,980 B2
(45) Date of Patent: Mar. 6, 2012

(54) AC ELECTRIC QUANTITY MEASURING DEVICE

(75) Inventor: Kempei Seki, Tokyo (JP)

(73) Assignee: Mitsubishi Electric Corporation, Chiyoda-Ku, Tokyo (JP)

( * ) Notice: Subject to any disclaimer, the term of this patent is extended or adjusted under 35 U.S.C. 154(b) by 421 days.

(21) Appl. No.: 12/521,021

(22) PCT Filed: Feb. 27, 2007

(86) PCT No.: PCT/JP2007/053594
§ 371 (c)(1),
(2), (4) Date: Jun. 24, 2009

(87) PCT Pub. No.: WO2008/120282
PCT Pub. Date: Oct. 9, 2008

(65) Prior Publication Data
US 2010/0019758 A1    Jan. 28, 2010

(51) Int. Cl.
*G01R 23/02* (2006.01)
*G01R 19/00* (2006.01)
*G01R 13/00* (2006.01)
(52) U.S. Cl. .................. 324/76.39; 702/64; 702/66
(58) Field of Classification Search ............ 324/76.39, 324/76.11, 71.1, 522, 555, 713; 702/1, 57, 702/64, 66, 71, 72, 75, 127
See application file for complete search history.

(56) References Cited

U.S. PATENT DOCUMENTS

| | | | |
|---|---|---|---|
| 5,832,414 A | 11/1998 | Hart et al. | |
| 6,212,446 B1 | 4/2001 | Sato | |
| 6,483,322 B2 * | 11/2002 | Aoyama et al. | ............... 324/661 |
| 6,662,124 B2 * | 12/2003 | Schweitzer et al. | ............ 702/65 |
| 7,334,472 B2 * | 2/2008 | Seo et al. | .................. 73/379.01 |
| 7,746,671 B2 * | 6/2010 | Radecker et al. | .......... 363/21.03 |
| 2001/0056330 A1 | 12/2001 | Wills | |
| 2004/0243329 A1 | 12/2004 | Seki | |
| 2005/0151532 A1 | 7/2005 | Seki | |
| 2006/0247874 A1 | 11/2006 | Premerlani et al. | |

FOREIGN PATENT DOCUMENTS

| | | |
|---|---|---|
| JP | 7-325636 A | 12/1995 |
| JP | 9-171038 A | 6/1997 |
| JP | 10-336883 A | 12/1998 |
| JP | 2002-323517 A | 11/2002 |
| JP | 2004-361124 A | 12/2004 |
| JP | 2005-204367 A | 7/2005 |
| JP | 2006-179323 A | 7/2006 |

(Continued)

OTHER PUBLICATIONS

PCT/ISA/ 210 for PCT/JP2007/053594 completed May 23, 2007.

(Continued)

*Primary Examiner* — Hoai-an D Nguyen
(74) *Attorney, Agent, or Firm* — Buchanan Ingersoll & Rooney PC

(57) ABSTRACT

In the present invention, a measured realtime accurate frequency is used to determine estimated instantaneous voltage/current time-series data for each phase component in accordance with the least-squares method. The estimated instantaneous voltage/current time-series data are used to determine effective voltage, effective current, instantaneous active electric power, instantaneous reactive electric power, effective active electric power, and effective reactive electric power of each phase component and symmetrical component. The measured AC electric quantities are applied to any type of electric power system control/protection apparatus.

11 Claims, 18 Drawing Sheets

FOREIGN PATENT DOCUMENTS

| WO | WO 99/27629 | 6/1999 |
|---|---|---|
| WO | 03/090327 A2 | 10/2003 |
| WO | WO 2007/052967 A1 | 5/2007 |

OTHER PUBLICATIONS

Phadke A G et al., "A New Measurement Technique for Tracking Voltage Phasors, Local System Frequency, and Rate of Change of Frequency", IEEE Transactions on Power Apparatus and Systems, May 1, 1983, pp. 1025-1038, XP008065061, ISSN: 0018-9510, vol. PAS-102, No. 5, IEEE Inc. New York, US.

Search Report from European Patent Office issued in Applicant's corresponding European Patent Application No. 07714987.0, dated Jul. 2, 2010.

* cited by examiner

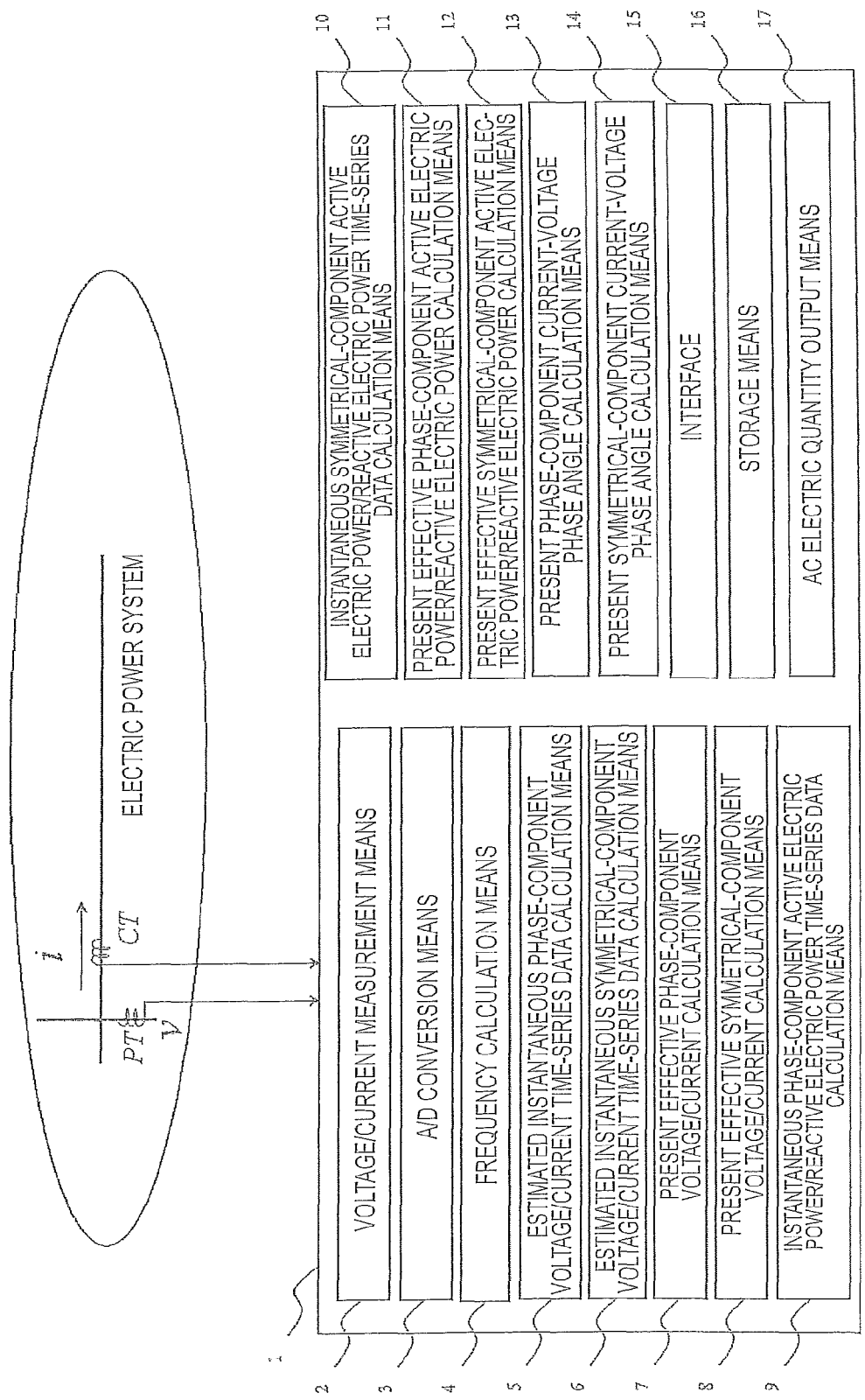
[FIG. 1]

[FIG. 2]
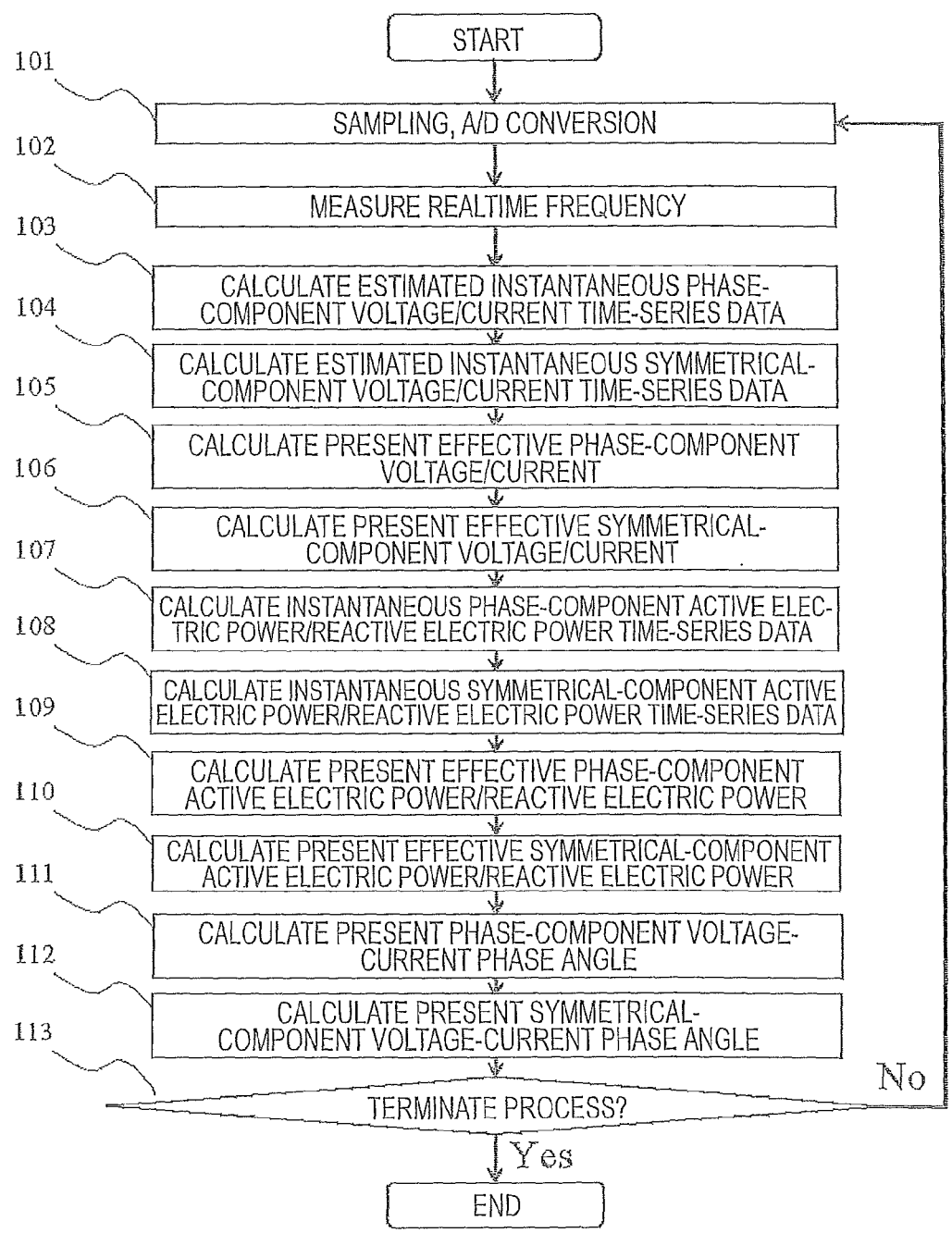

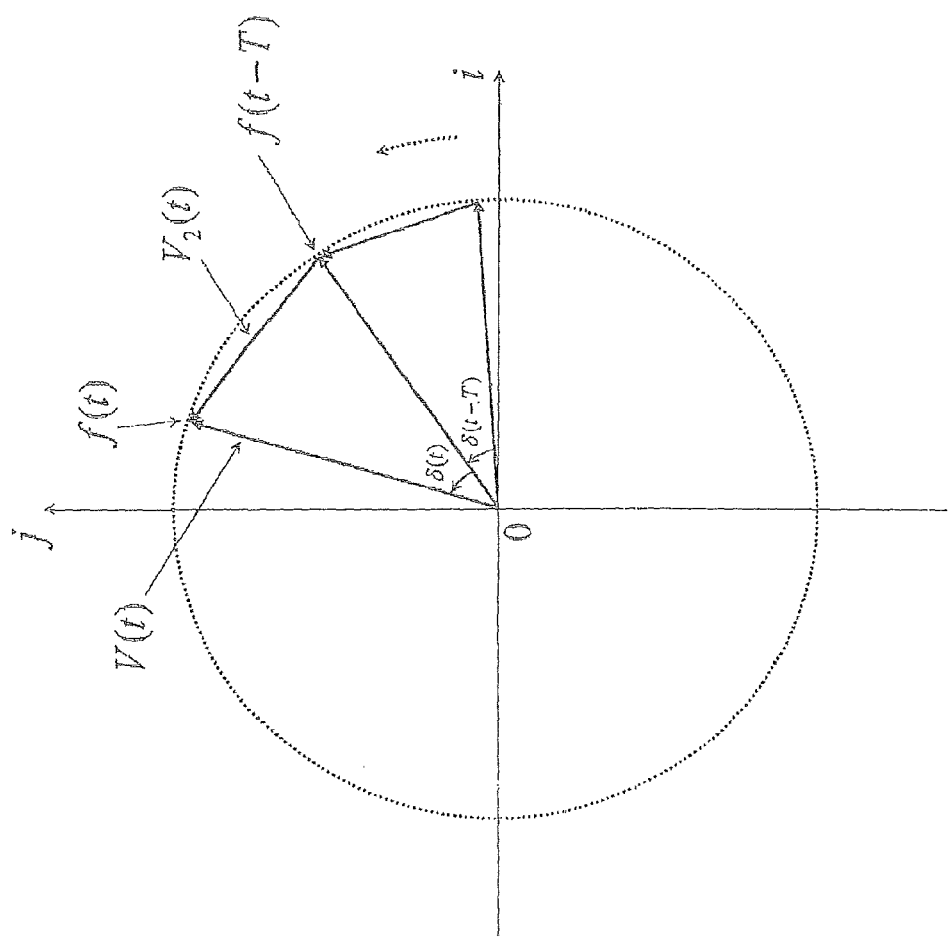
[FIG. 3]

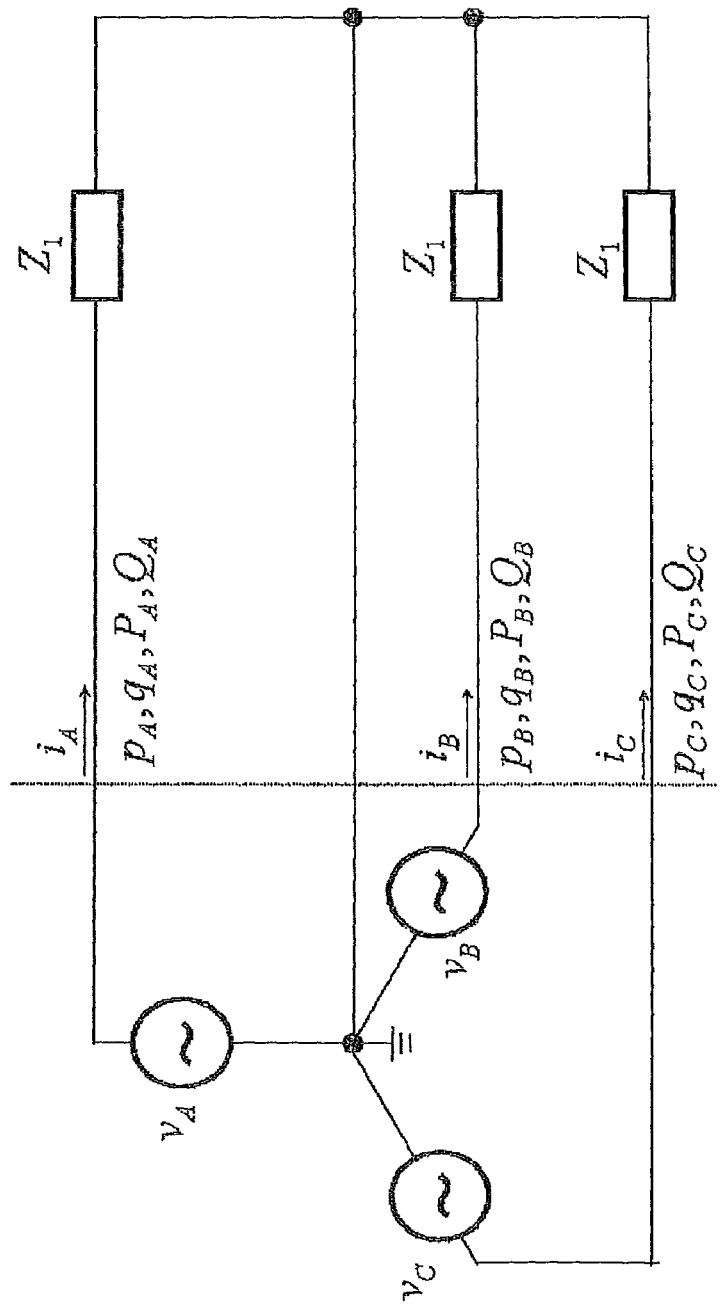
[FIG. 4]

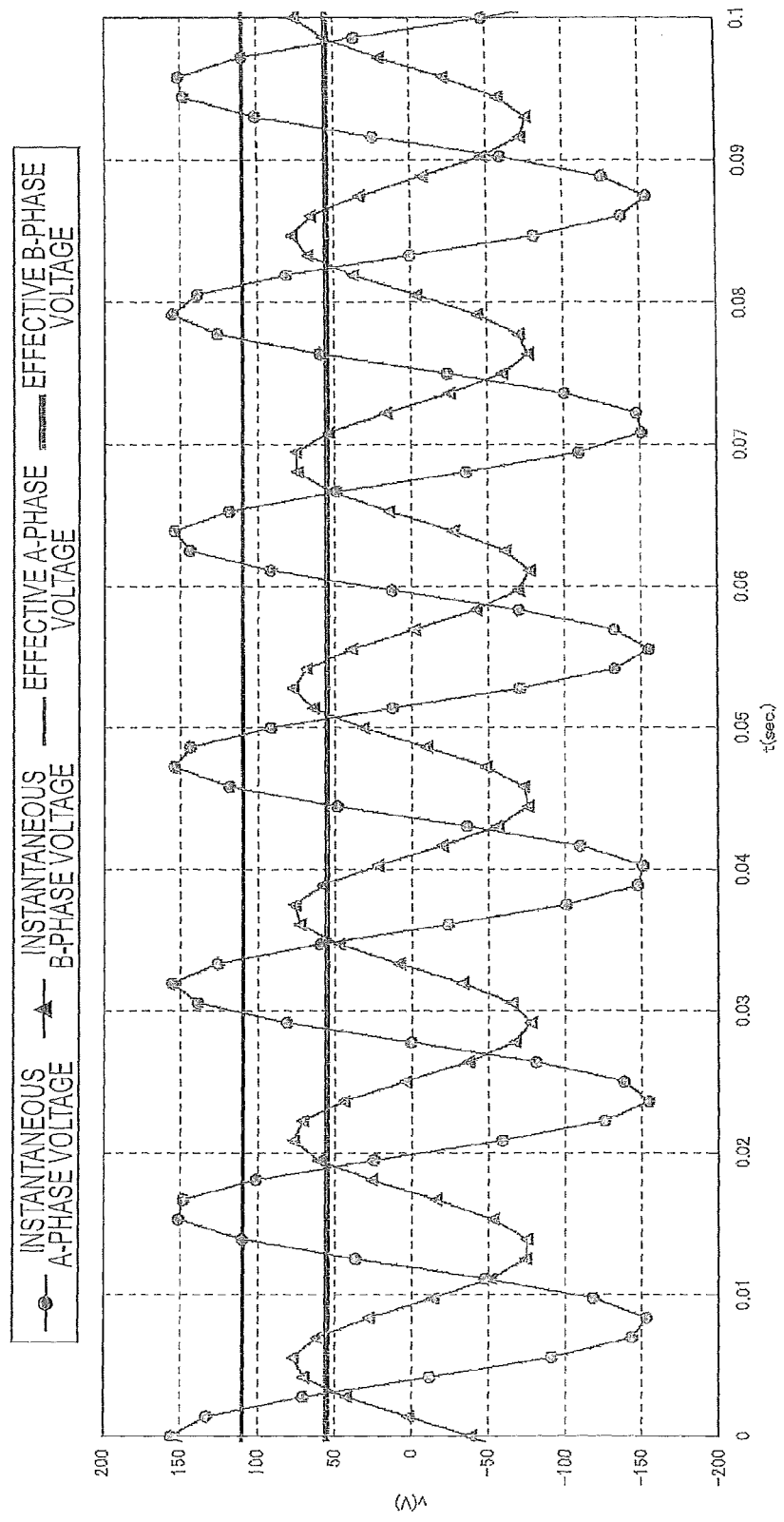
[FIG. 5]

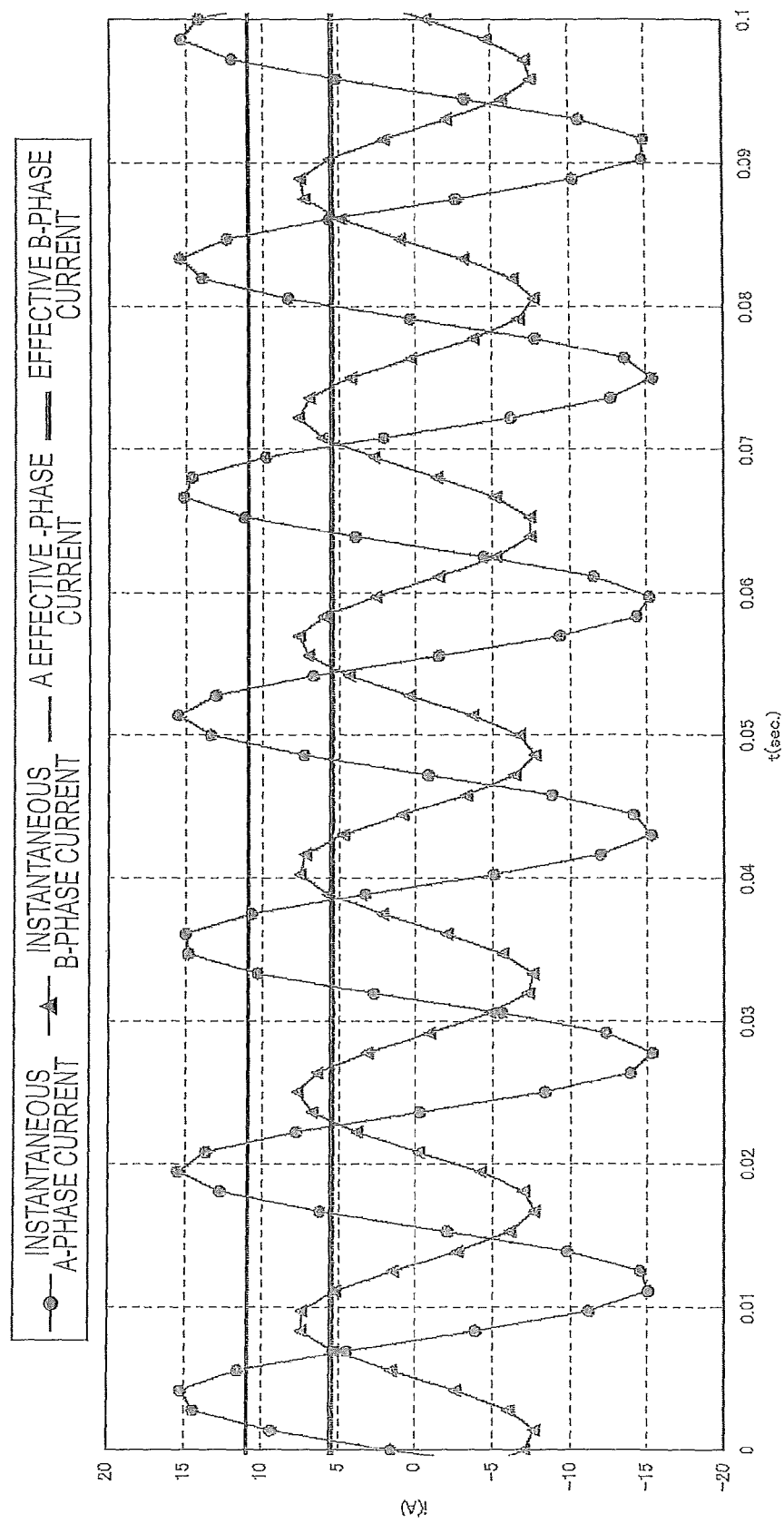
[FIG. 6]

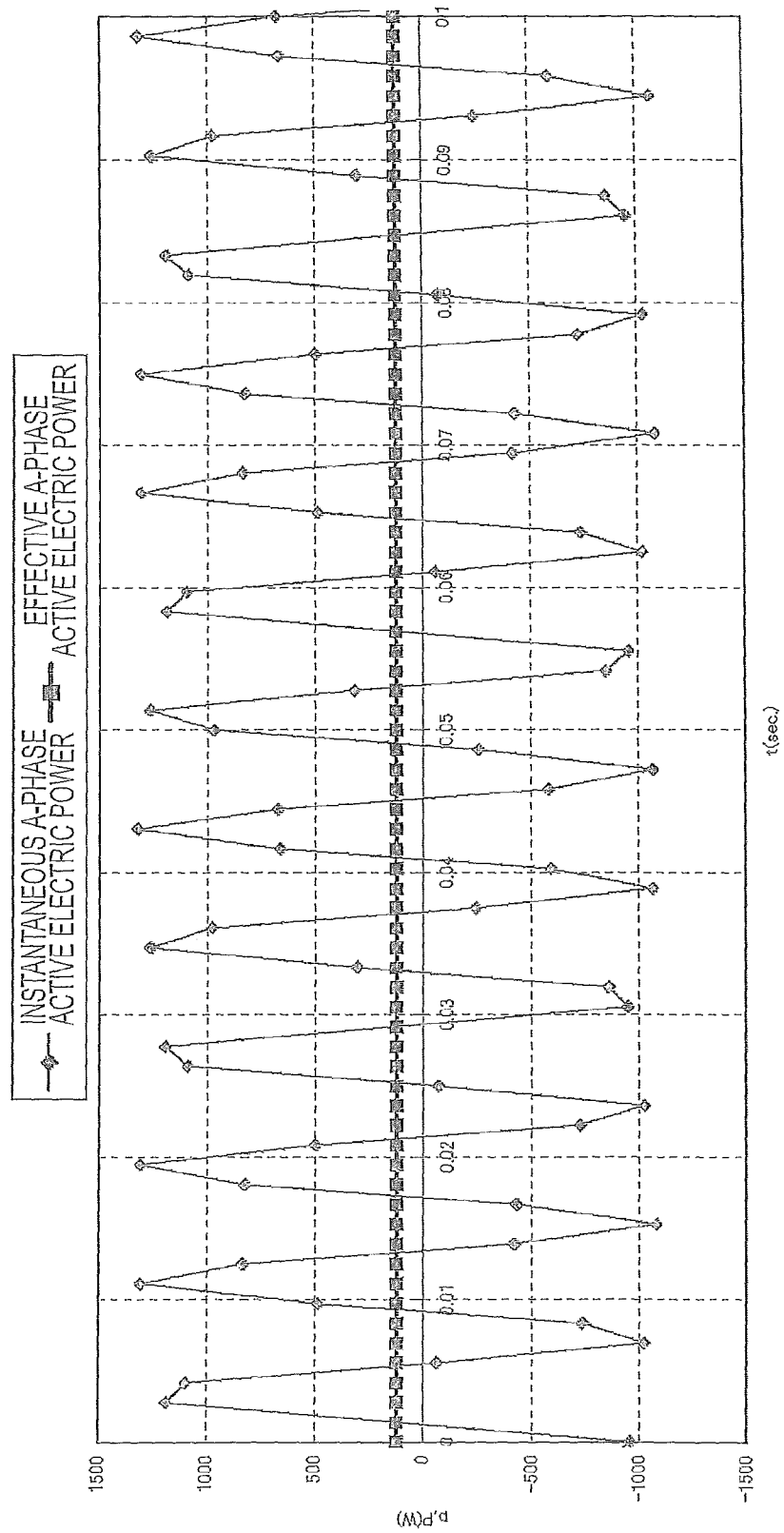
[FIG. 7]

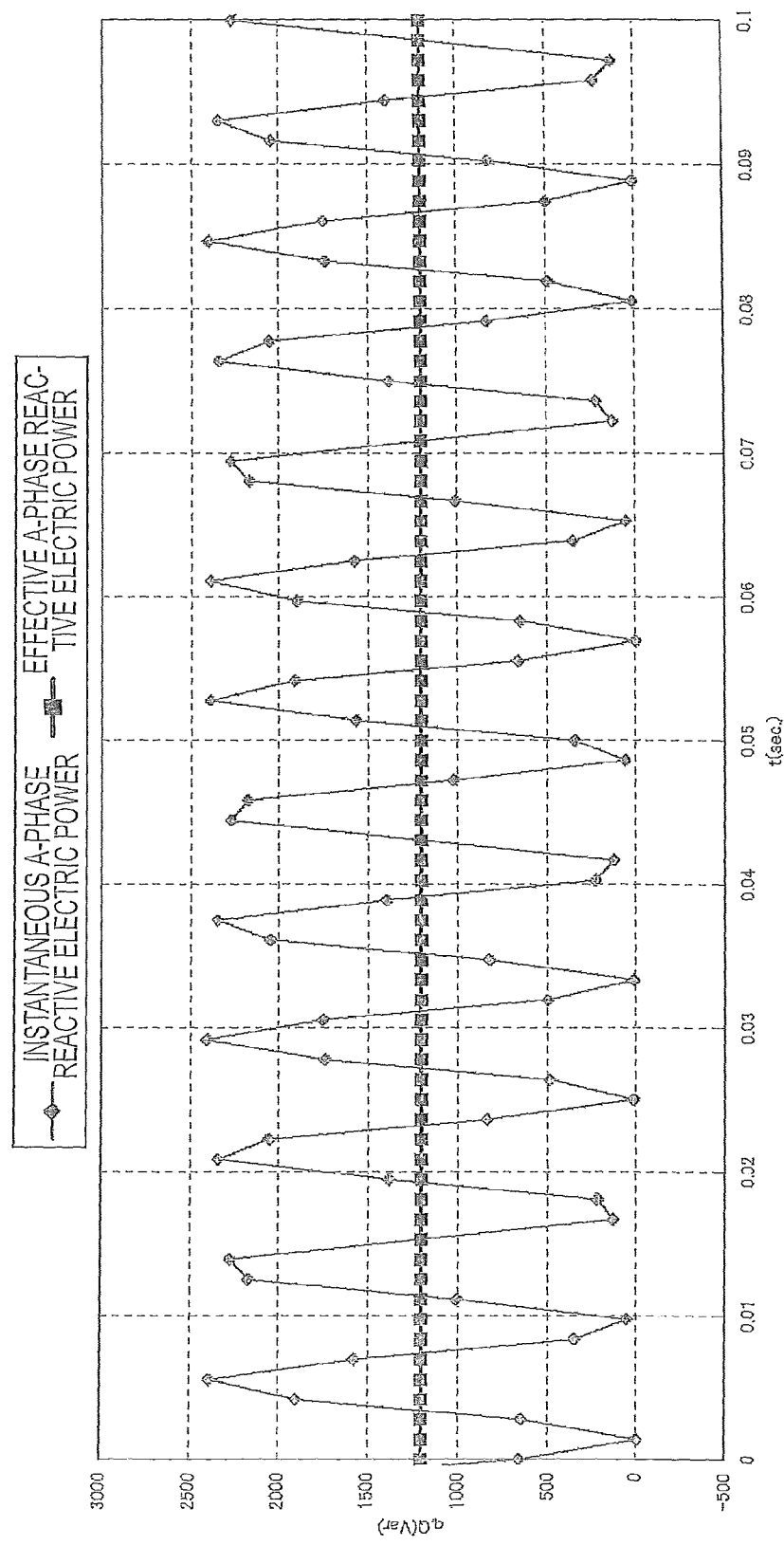
[FIG. 8]

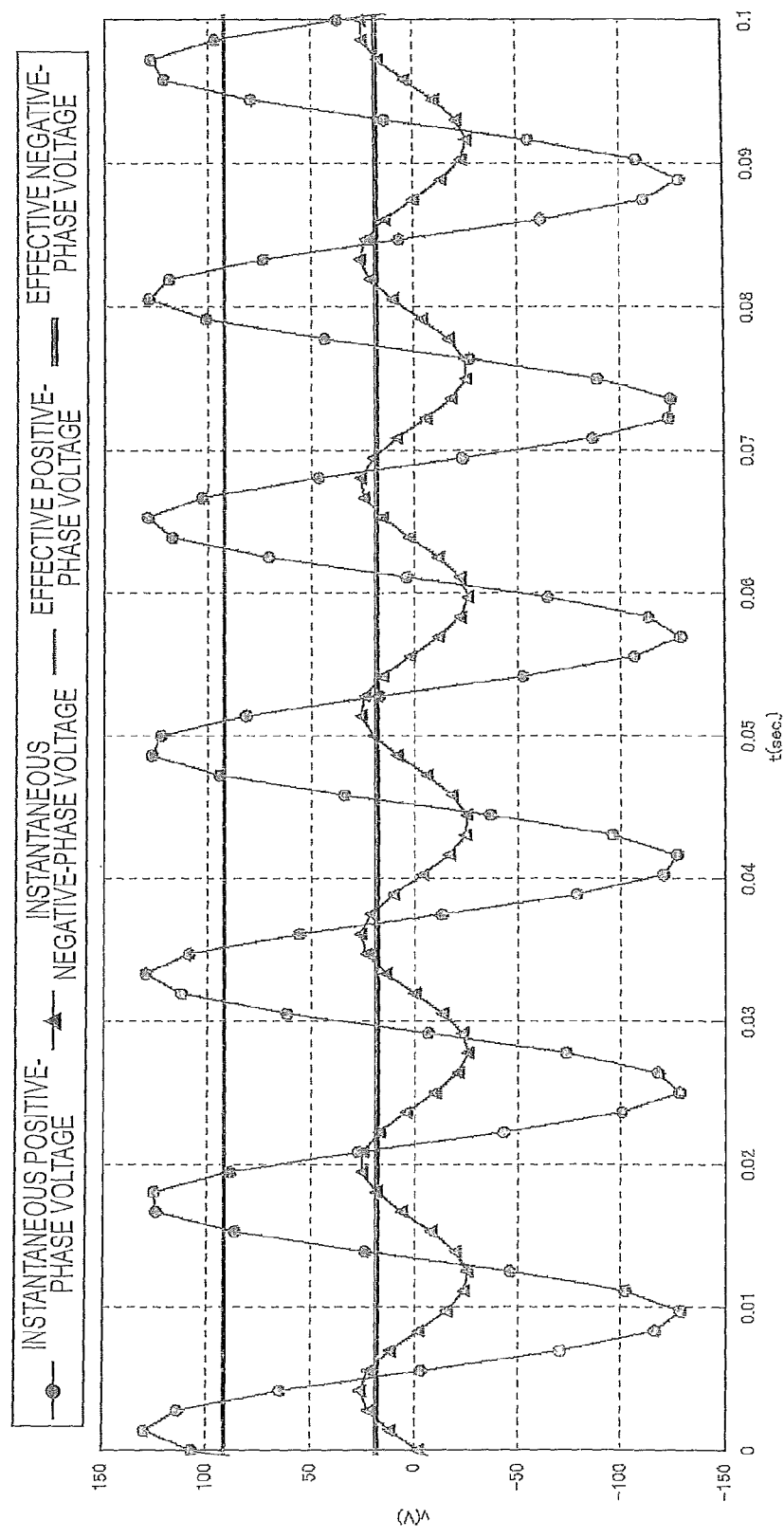
[FIG. 9]

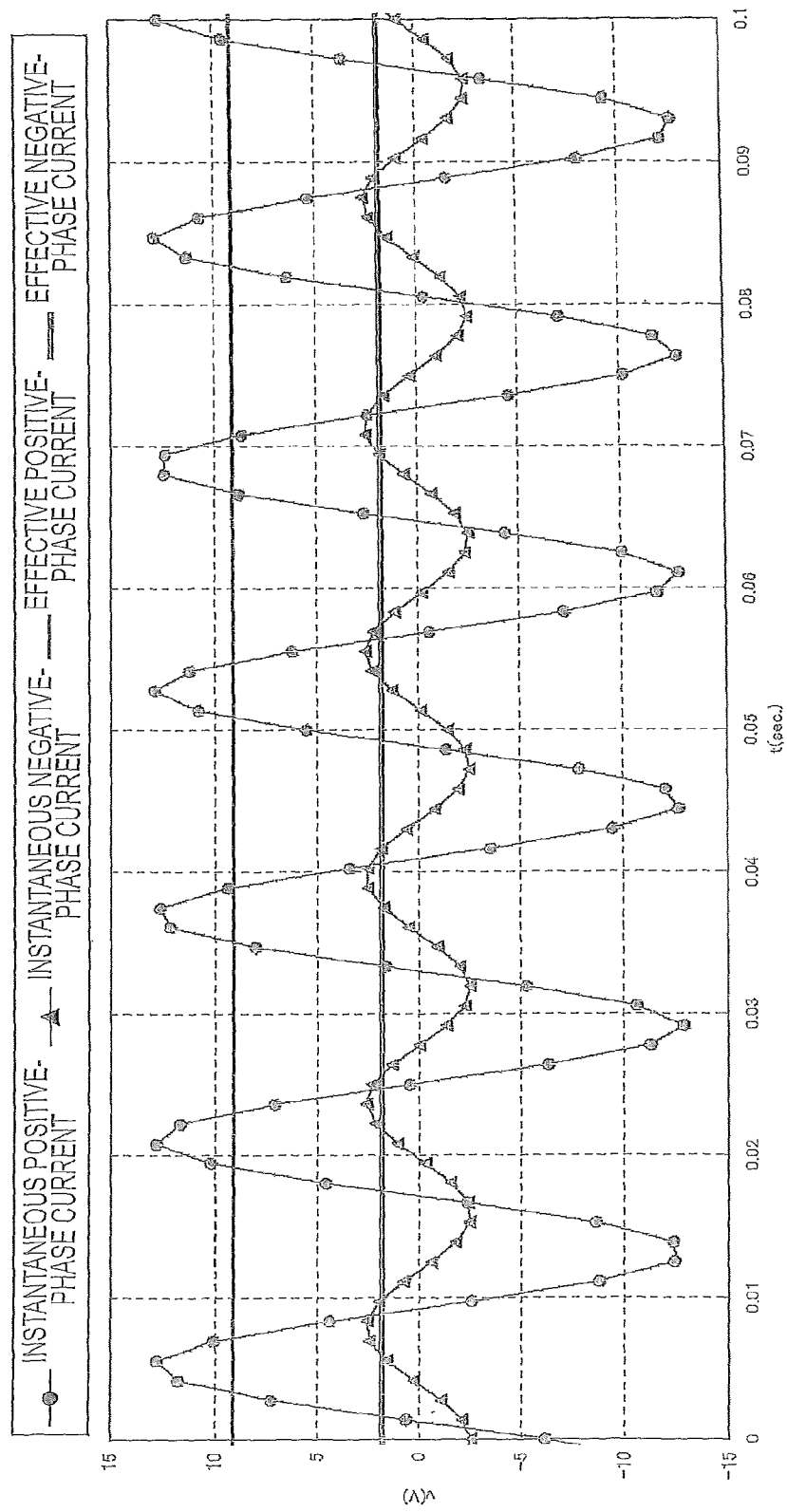
[FIG. 10]

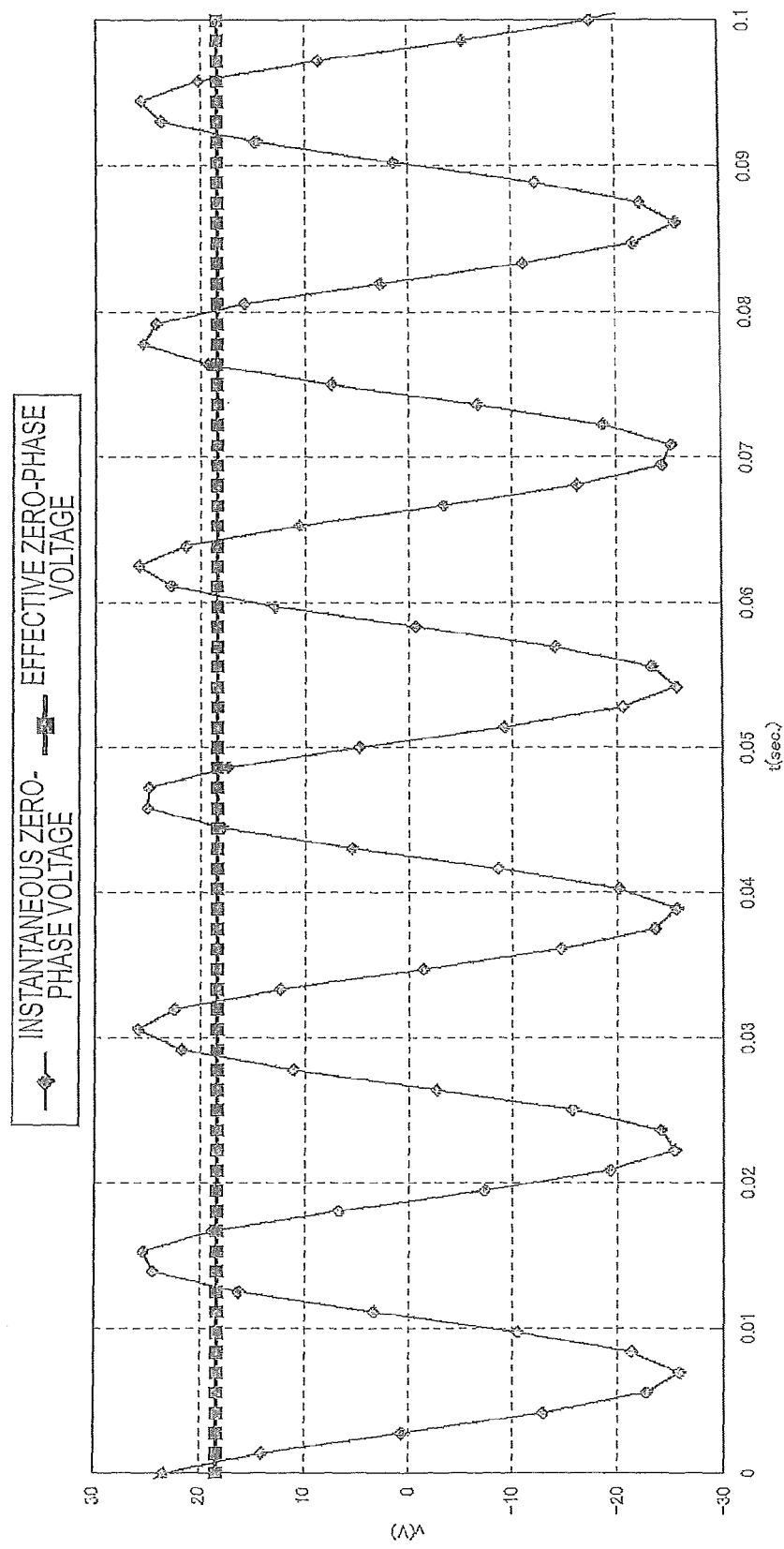
[FIG. 11]

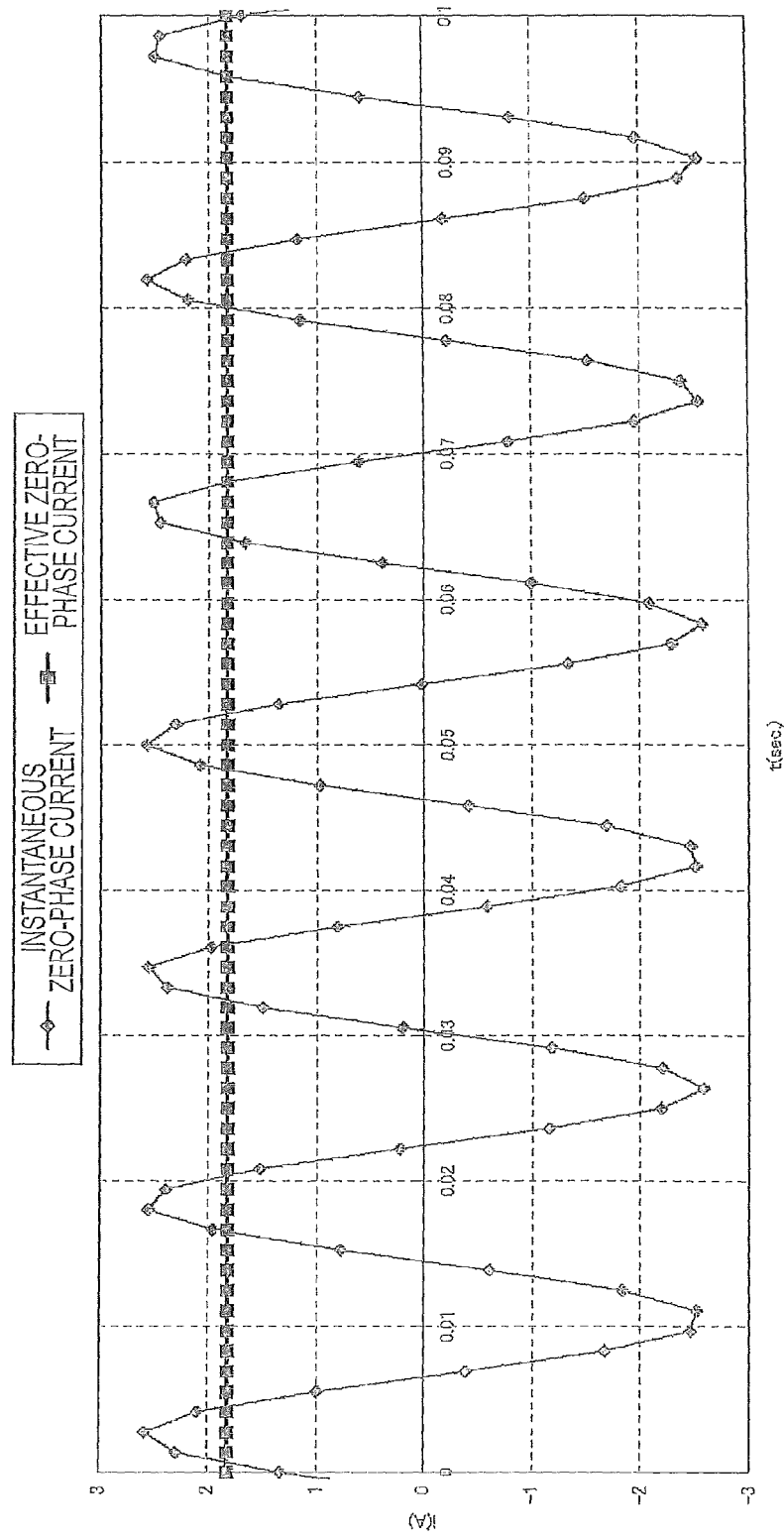
[FIG. 12]

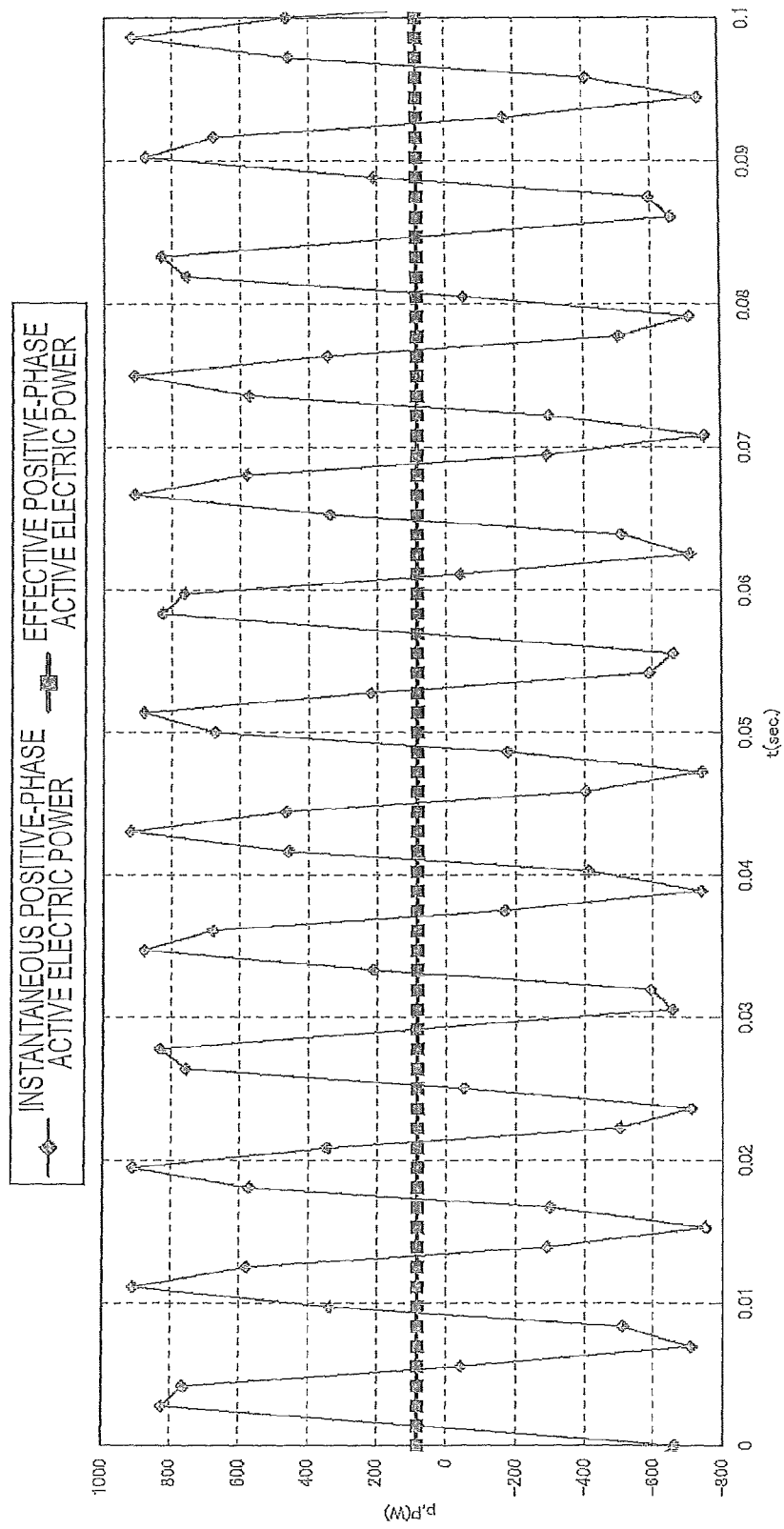
[FIG. 13]

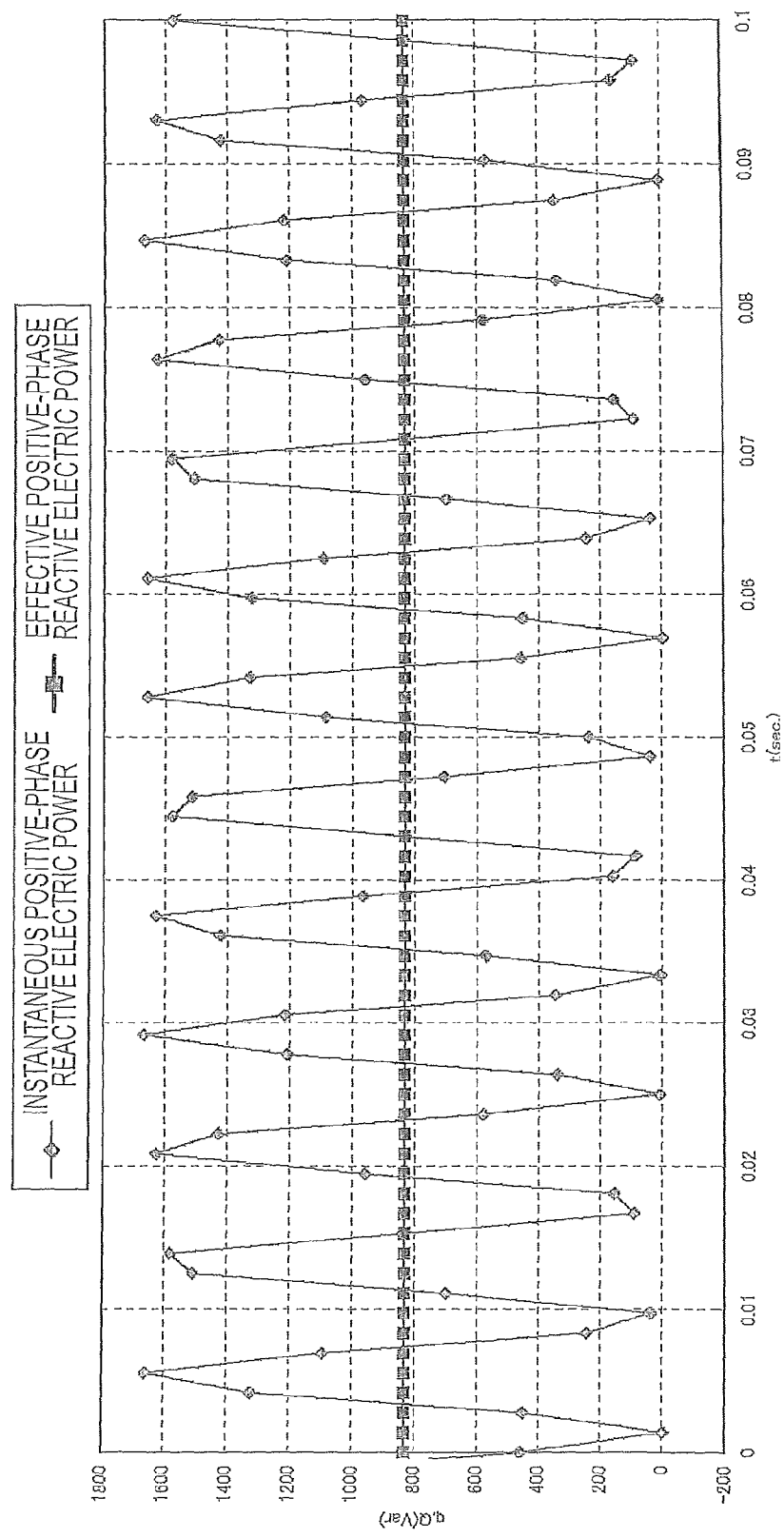
[FIG. 14]

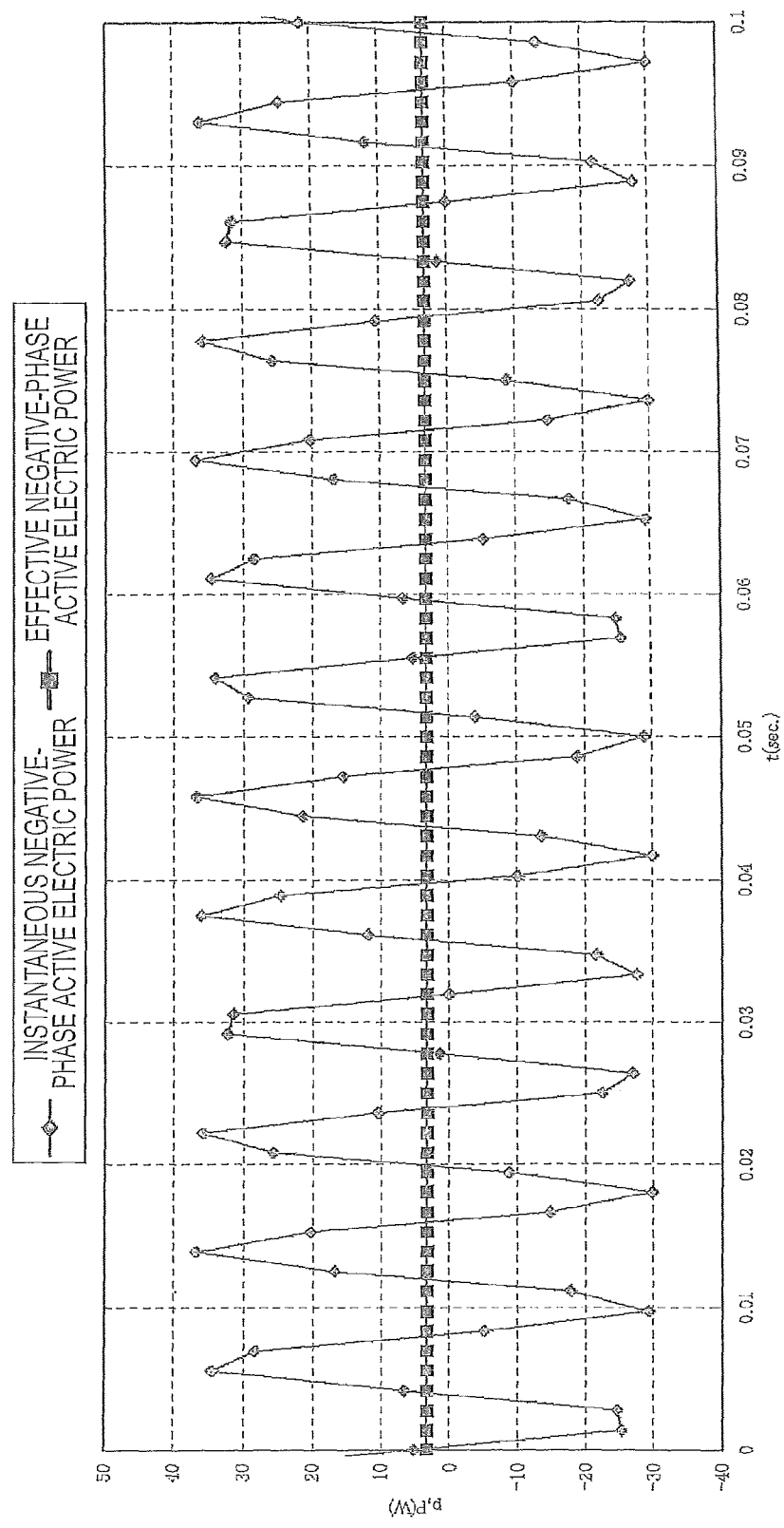
[FIG. 15]

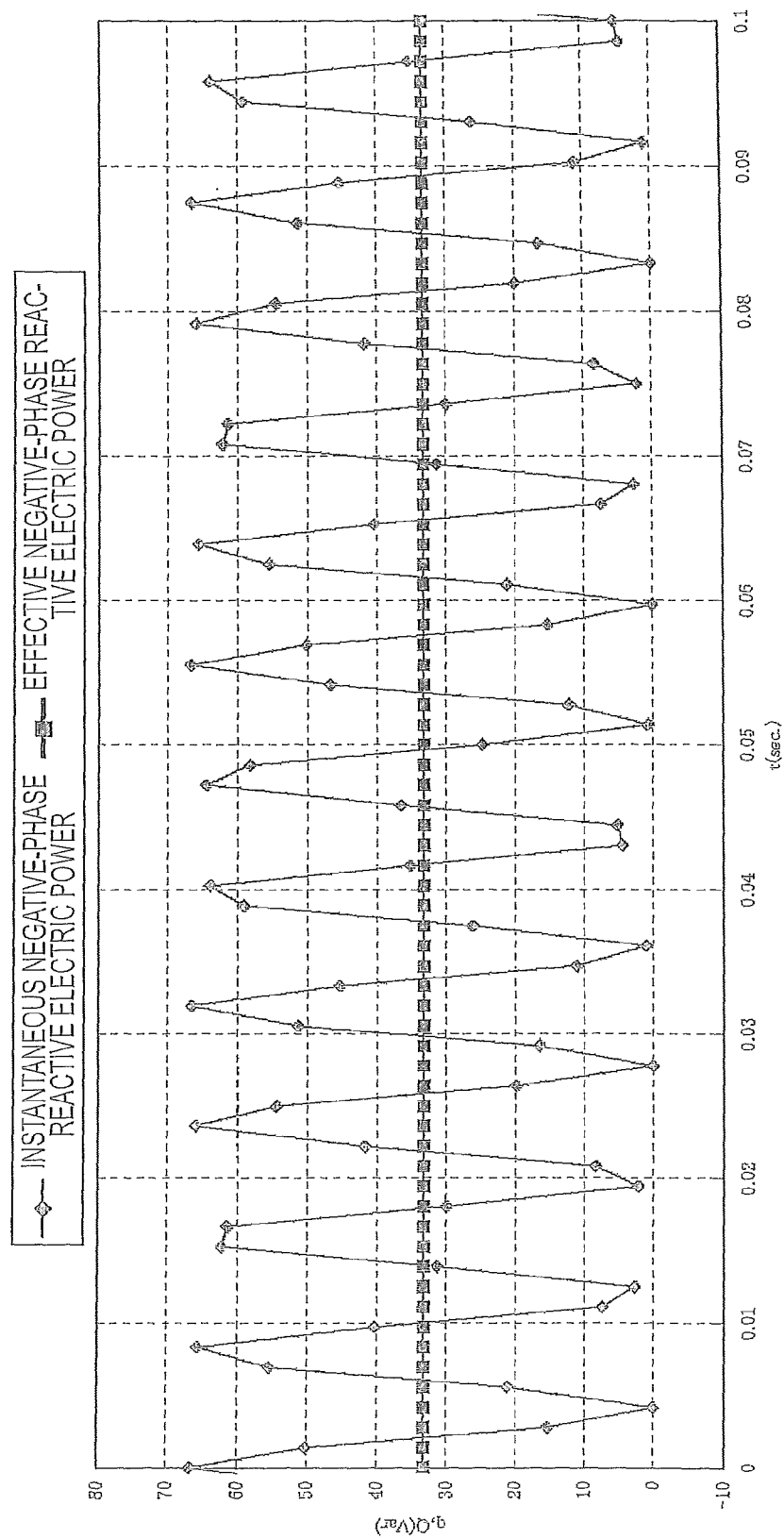
[FIG. 16]

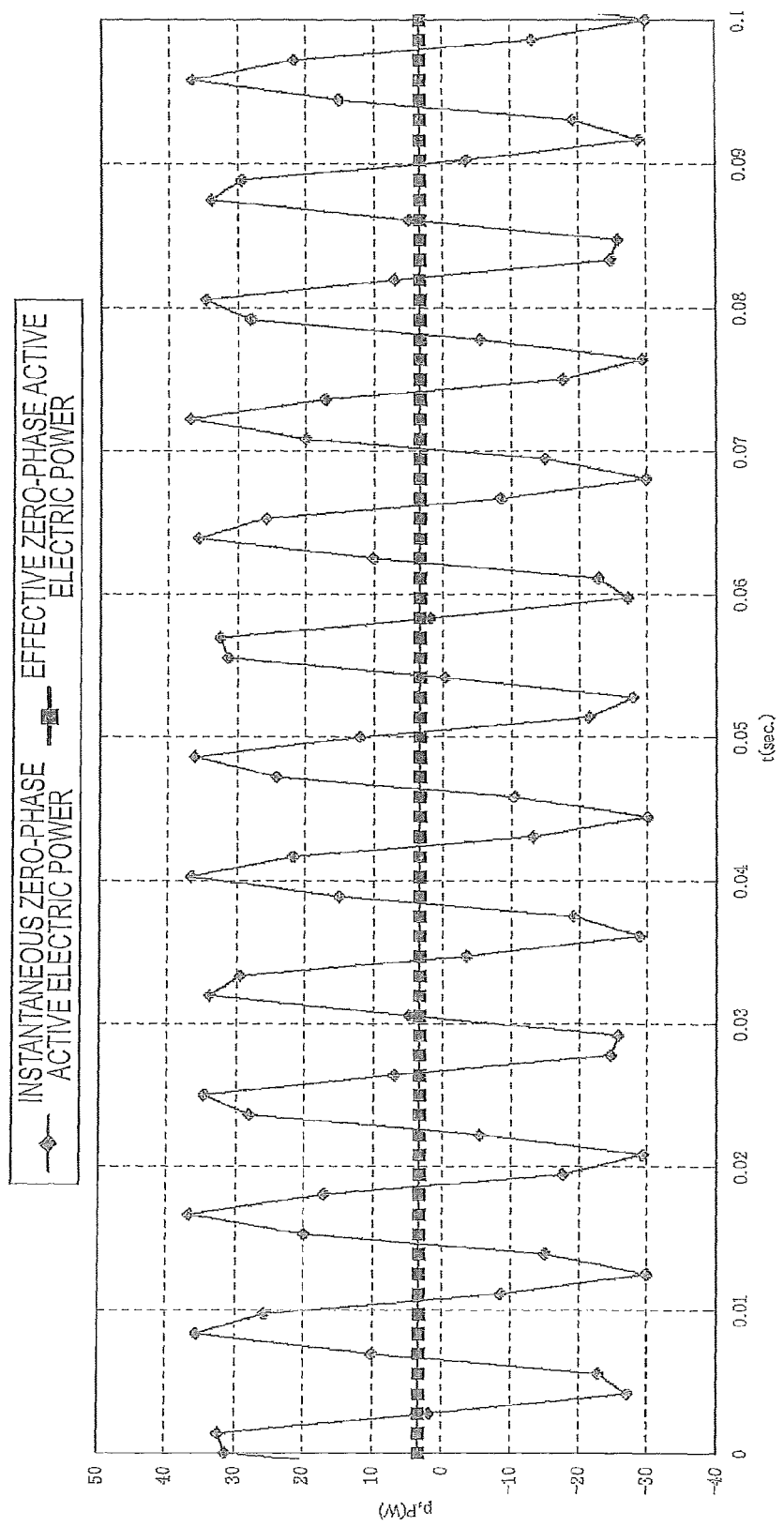
[FIG. 17]

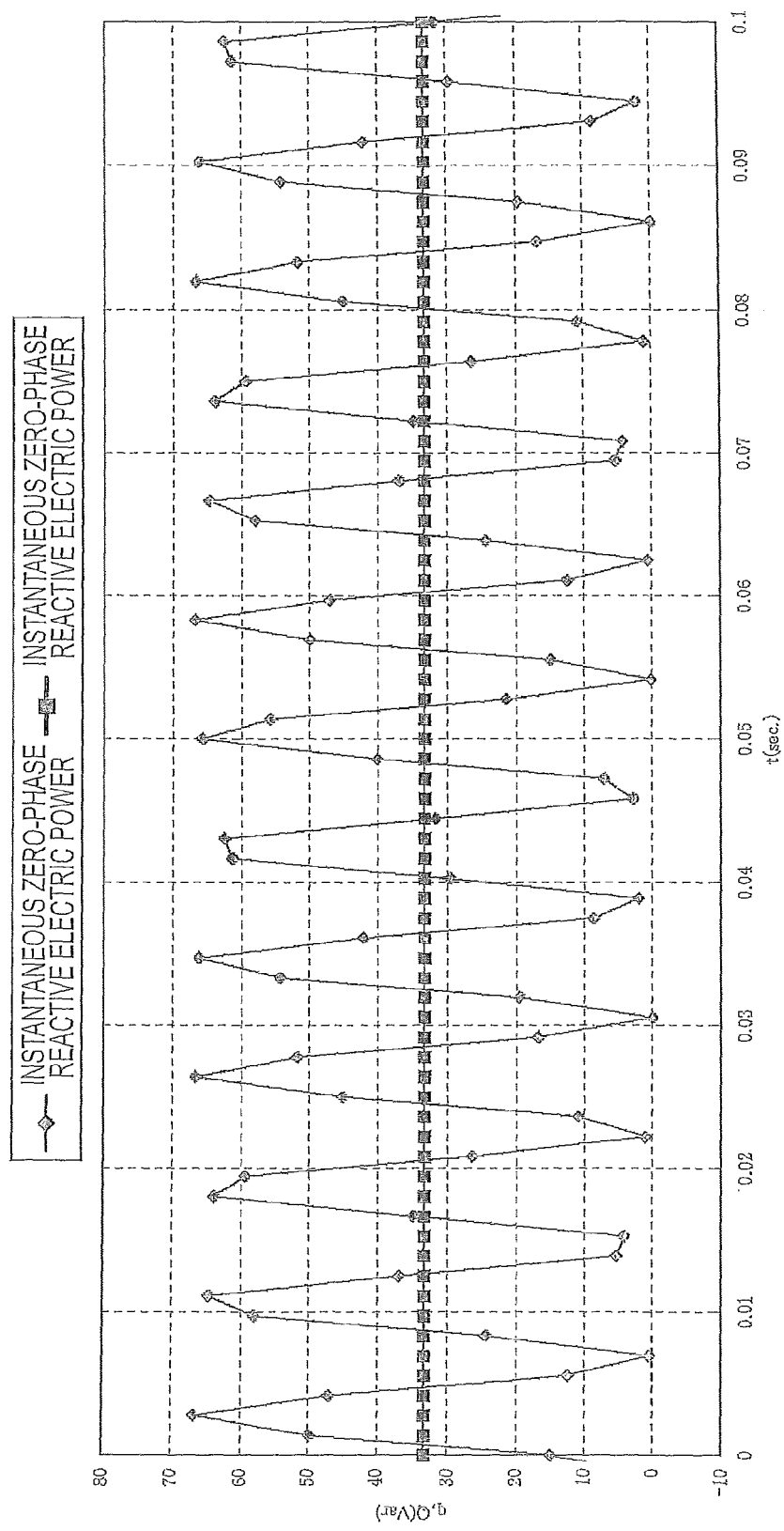
[FIG. 18]

AC ELECTRIC QUANTITY MEASURING DEVICE

TECHNICAL FIELD

The present invention relates to an AC electric quantity measuring device using a realtime frequency and the least-squares method, the realtime frequency obtained in accordance with a dynamic frequency measuring method.

BACKGROUND ART

In recent years, as the flow in electric power systems becomes sophisticated, there has been a need to supply reliable, high-quality electric power. In particular, there has been an increasing need to improve the performance of an AC electric quantity measuring device in a three-phase circuit, a single-phase circuit, and an arbitrary multi-phase circuit that are essential in an electric power system control/protection device.

The present inventor has already proposed that an approach based on a rotation vector on a complex plane is useful to improve the performance in controlling and protecting an electric power system. This proposal is based on a basic approach in which AC voltage and current are expressed as vectors that rotate counterclockwise in a complex plane. For example, as described in Patent Document 1, the approach measures the voltages of an electric power system at timings obtained by evenly dividing one cycle of a reference wave by 4N (N is a positive integer), determines a voltage rotation vector the head of which has the voltage measured at a certain timing as the real-part coordinate and the voltage measured 90 degrees before as the imaginary-part coordinate, calculates the length of the chord connecting the head of the voltage rotation vector to the head of the preceding voltage rotation vector, determines an effective voltage from the voltages measured during the period from the certain timing to the timing one cycle of the reference wave before, and calculates the frequency of the electric power system from the phase angle of the voltage rotation vector calculated based on the sum of the chord lengths and the effective voltage. In Non-Patent Document 1, which presents a variety of equations for calculating AC electric quantities, a rated frequency of a system (50 or 60 Hz) is used to calculate AC electric quantities. In the present technology, when the frequency of the system deviates from the rated frequency, the frequency of the system is corrected in accordance with a frequency-gain characteristic curve or a fundamental wave is extracted in accordance with Fourier transform. In either case, a long computation time is required or the result has a large error.

FIG. 3 is a voltage rotation vector diagram expressed on a complex plane, where an instantaneous voltage v of an electric power system rotates counterclockwise around the origin O on the complex plane. The one-cycle period of a reference wave is divided into 4N portions (N is an integer), and the incremental period per step T is (60 Hz-system, 30-electrical-degree sampling (12 points/cycle sampling), T=1/60/12=0.00138889 seconds, for example). The rotation phase angle per step can be calculated as follows:

$$\delta(t) = 2\sin^{-1}\left\{\frac{V_2(t)}{2V(t)}\right\} \quad (1)$$

In the equation, $V(t)$ represents the amplitude of the voltage, and $V_2(t)$ represents the length of the chord that subtends the rotation phase angle.

It is assumed that the amplitude and the chord length are obtained by performing integral operation on one-cycle instantaneous value data. The frequency is then calculated by the following equation:

$$f(t) = \frac{\psi(t)}{2\pi}f_0 = \frac{4N \cdot \delta(t)}{2\pi}f_0 \quad (2)$$

In the equation, $\psi(t)$ represents the one-cycle rotation phase angle of the voltage rotation vector, and $f_0$ represents the reference wave frequency (50 or 60 Hz).

However, since phase variation due to voltage flickering or other produces errors in the voltage amplitude and the chord length, the frequency measurement result obtained from the equation (2) also contains a certain error. As described above, the equation (2) represents what is called a static frequency measuring method, which provides good measurement accuracy in a stationary state (sinusoidal wave), whereas inevitably producing an error when the phase varies, for example, due to voltage flickering. A method for addressing the problem that has been typically practiced in the present technology involves averaging frequency measurement results for an extended period (averaging processing) to remove the influence of voltage flickering. Such a frequency measuring device cannot therefore measure the frequency in real time, which poses a problem in high-speed, high-accuracy AC electric quantity measurement.

Patent Document 1: JP-A-2004-361124

Patent Document 2: WO-PCT/JP2007/052967

Non-Patent Document 1: "Development of Integral Method for Measuring RMS Active and Reactive Power in Single- and Multiphase Networks," pp. 250-255, CEPSI 2002, Fukuoka, Japan

DISCLOSURE OF THE INVENTION

Problems that the Invention is to Solve

In the AC electric quantity measuring technology of the related art described above, which is a static AC electric quantity measuring method, the measurement is carried out on a sinusoidal waveform from an electric power system and errors resulting from frequency variation and phase variation (voltage flickering) are compensated by averaging or the like. AC electric quantities cannot therefore be measured in a quickly, accurate manner.

To address the problem, the present inventor has already proposed an actual realtime frequency measuring method using the following equation (see Patent Document 2):

$$f(t) = f(t-T) + \Delta f(t) = f(t-T) + \frac{\delta(t) - \delta(t-T)}{2\pi T} \quad (3)$$

In the equation, $f(t)$ represents the present frequency; $f(t-T)$ represents the frequency measured one step before; $\delta(t)$ represents the present calculated rotation phase angle; and $\delta(t-T)$ represents the rotation phase angle calculated one step before.

Further, the present inventor has proposed the following dynamic frequency calculating equation in which the frequency difference portion in the equation (3) is multiplied by a variable acceleration factor Nf:

$$f(t) = f(t-T) + N_f \cdot \frac{\delta(t) - \delta(t-T)}{2\pi T} \quad (4)$$

An object of the invention is to provide an AC electric quantity measuring device that uses a realtime frequency measured in accordance with the dynamic frequency measuring method described above to calculate AC electric quantity other than the frequency with accuracy without any influence of harmonic or flickering (phase variation).

Means for Solving the Problems

An AC electric quantity measuring device of the invention includes voltage/current measurement means for measuring time-series data on the voltage/current of a system, frequency calculation means for calculating a realtime frequency by determining the amplitude, the chord length, and the rotation phase angle of a voltage rotation vector by performing integral computation on the time-series data obtained by the voltage/current measurement means and determining the rate of change in frequency per step, and estimated instantaneous phase-component voltage/current time-series data calculation means for calculating estimated instantaneous sinusoidal voltage/current time-series data for each phase component in accordance with the least-squares method by using the realtime frequency and the instantaneous voltage/current time-series data for the phase component, characterized in that the sampling increments in which the instantaneous voltage/current time-series data are measured are set to a fixed frequency, and the sampling increments in which the instantaneous voltage/current time-series data for each phase component are estimated are set to a measured frequency.

Advantage of the Invention

The estimated instantaneous voltage/current time-series data for each phase component described above can be used to calculate a variety of AC electric quantities other than the frequency, such as an effective voltage of each phase component, an effective voltage of each symmetrical component, an effective current of each phase component, an effective current of each symmetrical component, an instantaneous active electric power of each phase component, an instantaneous active electric power of each symmetrical component, an instantaneous reactive electric power of each phase component, an instantaneous reactive electric power of each symmetrical component, an effective active electric power of each phase component, an effective reactive electric power of each phase component, an effective active electric power of each symmetrical component, and an effective reactive electric power of each symmetrical component. Measuring the AC electric quantities of an electric power system that suffers from noise and voltage flickering in a quick, accurate manner can contribute to improvement in performance of an electric power system control/protection device. Since the estimated instantaneous voltage/current time-series data are not measured values but sinusoidal data calculated in accordance with the least-squares method and are estimated in sampling increments calculated by using a measured frequency, the AC electric quantities are measured with accuracy.

Further, the fact that low-accuracy measured instantaneous data provide high-accuracy AC electric quantities provides an associated advantage of cost reduction of the electric power system control/protection device by using, for example, a low-accuracy, inexpensive A/D converter.

BRIEF DESCRIPTION OF THE DRAWINGS

FIG. 1 shows the configuration of an AC electric quantity measuring device according to the invention;
FIG. 2 is a flowchart explaining the operation of the AC electric quantity measuring device of the invention;
FIG. 3 explains a rotation phase angle of a voltage rotation vector on a complex plane;
FIG. 4 shows a model system diagram in a first embodiment of the invention;
FIG. 5 shows the relationship between instantaneous A-phase and B-Phase voltage waveforms and effective A-phase and B-Phase voltage waveforms in the first embodiment of the invention;
FIG. 6 shows the relationship between instantaneous A-phase and B-Phase current waveforms and effective A-phase and B-Phase current waveforms in the first embodiment of the invention;
FIG. 7 shows the relationship between an instantaneous A-phase active electric power waveform and an effective A-phase active electric power waveform in the first embodiment of the invention;
FIG. 8 shows the relationship between an instantaneous A-phase reactive electric power waveform and an effective A-phase reactive electric power waveform in the first embodiment of the invention;
FIG. 9 shows the relationship between instantaneous positive-phase and negative-phase voltage waveforms and effective positive-phase and negative-phase voltage waveforms in the first embodiment of the invention;
FIG. 10 shows the relationship between instantaneous positive-phase and negative-phase current waveforms and effective positive-phase and negative-phase current waveforms in the first embodiment of the invention;
FIG. 11 shows the relationship between instantaneous and effective zero-phase voltage waveforms in the first embodiment of the invention;
FIG. 12 shows the relationship between instantaneous and effective zero-phase current waveforms in the first embodiment of the invention;
FIG. 13 shows the relationship between instantaneous and effective positive-phase active electric power waveforms in the first embodiment of the invention;
FIG. 14 shows the relationship between instantaneous and effective positive-phase reactive electric power waveforms in the first embodiment of the invention;
FIG. 15 shows the relationship between instantaneous and effective negative-phase active electric power waveforms in the first embodiment of the invention;
FIG. 16 shows the relationship between instantaneous and effective negative-phase reactive electric power waveforms in the first embodiment of the invention;
FIG. 17 shows the relationship between instantaneous and effective zero-phase active electric power waveforms in the first embodiment of the invention; and
FIG. 18 shows the relationship between instantaneous and effective zero-phase reactive electric power waveforms in the first embodiment of the invention.

BEST MODE FOR CARRYING OUT THE INVENTION

First Embodiment

FIG. 1 is a configuration diagram of an AC electric quantity measuring device in an electric power system according to the invention. In FIG. 1, reference character PT denotes a voltage transformer for an instrument; reference character CT denotes a current transformer; reference character v denotes a voltage; and reference character i denotes a current. For the sake of simplicity, only the portion corresponding to a single phase is shown.

Reference numeral 1 denotes an AC electric quantity measuring device to which the invention is directed, and is comprised of a computer including a variety of functional means described below. That is, reference numeral 2 denotes voltage/current measurement means to which time-series data measured with PT and CT described above are inputted. Reference numeral 3 denotes A/C conversion means for converting the time-series analog data into time-series digital data. Reference numeral 4 denotes frequency calculation means for measuring the frequency of the system in real time in accordance with the dynamic frequency measuring method that the present inventor has already proposed. The frequency calculation means calculates a realtime frequency by determining the amplitude, the chord length, and the rotation phase angle of the voltage rotation vector by performing integral computation on the time-series data on the voltage/current of the system and determining the rate of change in frequency per step. For details, see International Application WO-PCT/JP2007/052967, which is an application prior to the present application.

Reference numeral 5 denotes estimated instantaneous phase-component voltage/current time-series data calculation means for calculating estimated instantaneous voltage/current time-series data for each phase component by using the realtime frequency and the instantaneous voltage/current time-series data for the phase component in accordance with the least-squares method. In this embodiment, the least-squares method is used to estimate coefficient parameters of the sinusoidal wave of the voltage/current of each phase component (the time increments for the calculation are a reference frequency divided by 4N), and the estimated coefficient parameters of the sinusoidal wave are used to calculate data for a single cycle of the sinusoidal wave (the time increments for the calculation are a measured frequency divided by 4N). The procedure will be described later in detail with reference to the flowchart in FIG. 2. Reference numeral 6 denotes estimated instantaneous symmetrical-component voltage/current time-series data calculation means for determining estimated instantaneous voltage/current time-series data for symmetrical components in accordance with the method of symmetrical coordinates.

Reference numeral 7 denotes present effective phase-component voltage/current calculation means for determining present effective voltage/current of each phase component by using the estimated instantaneous voltage/current time-series data for the phase component calculated by the estimated instantaneous phase-component voltage/current time-series data calculation means 5. Reference numeral 8 denotes present effective symmetrical-component voltage/current calculation means for determining present effective voltage/current of symmetrical components by using the estimated instantaneous voltage/current time-series data for symmetrical components calculated by the estimated instantaneous symmetrical-component voltage/current time-series data calculation means 6. Reference numeral 9 denotes estimated instantaneous phase-component active electric power/reactive electric power time-series data calculation means for determining estimated instantaneous active electric power/reactive electric power time-series data for each phase component by using the estimated instantaneous voltage/current time-series data for the phase component calculated by the estimated instantaneous phase-component voltage/current time-series data calculation means.

Reference numeral 10 denotes estimated instantaneous symmetrical-component active electric power/reactive electric power time-series data calculation means for determining estimated instantaneous active electric power/reactive electric power time-series data for symmetrical components by using the estimated instantaneous voltage/current time-series data for symmetrical components calculated by the estimated instantaneous symmetrical-component voltage/current time-series data calculation means 6. Reference numeral 11 denotes present effective phase-component active electric power/reactive electric power calculation means for determining present effective active electric power/reactive electric power of each phase component by using the estimated instantaneous active electric power/reactive electric power time-series data for the phase component calculated by the estimated instantaneous phase-component active electric power/reactive electric power time-series data calculation means 9.

Reference numeral 12 denotes present effective symmetrical-component active electric power/reactive electric power calculation means for determining present effective active electric power/reactive electric power of symmetrical components by using the estimated instantaneous active electric power/reactive electric power time-series data for symmetrical components calculated by the estimated instantaneous symmetrical-component active electric power/reactive electric power time-series data calculation means 10. Reference numeral 13 denotes present phase-component current-voltage phase angle calculation means for determining the present phase angle between the current and voltage of each phase component by using the present effective active electric power and reactive electric power of the phase component. Reference numeral 14 denotes present symmetrical-component current-voltage phase angle calculation means for determining the present phase angle between the current and voltage of symmetrical components by using the present effective active electric power and reactive electric power of symmetrical components. Reference numeral 15 denotes an interface for displaying the calculation results. Reference numeral 16 denotes storage means for saving the measured values. Reference numeral 17 denotes AC electric quantity output means for outputting the measurement results to a system control/protection device.

The specific functions of the AC electric quantity measuring device described above will be described with reference to an AC electric quantity measurement flowchart shown in FIG. 2 along with calculating equations used in each step. In the following measurement, a reference wave is divided by 4N (N is a positive integer), and in the following calculation, N=3, 12; the electrical angle is 30 degrees; and T=0.001388889 seconds (60-Hz system), T=0.001666667 seconds (50-Hz system). Since a greater N will increase the measurement accuracy but disadvantageously increase the load on the computer (require an expensive, high-performance CPU), an appropriate sampling time increments (4N) should be selected in accordance with the performance of the CPU. In the following calculation, the period during which instantaneous voltage/current are sampled is 2 cycles (the number of sampled data is 24). Other types of sampled data can alternatively be used depending on a particular use of the data. For example, the data sampling period is ¼ cycle for a device that is required to quickly determine an effective failure current.

First, in the step 101, the voltage/current measurement means 2 samples voltage/current to measure instantaneous voltage/current, and the A/D conversion means 3 performs A/D conversion. According to Fourier transform, an instantaneous voltage in a circuit can be expressed as follows:

$$v_A(t) = \sqrt{2}\, V_A e^{j(\omega t+\varphi_A)} + \sqrt{2}\sum_{k=1}^{M} V_{Ak} e^{j(\omega_k t+\varphi_{Ak})} \quad (5)$$

In the equation, $V_A$ represents an effective fundamental wave voltage; $\omega$ represents a fundamental wave angular velocity; $\phi_A$ represents a fundamental wave voltage initial phase; $V_{Ak}$ represents an effective k-th harmonic voltage; $\omega_k$ represents a k-th harmonic voltage angular velocity; $\phi_{Ak}$ represents a k-th harmonic voltage initial phase; and M represents an arbitrary positive integer.

That is, an instantaneous voltage includes a voltage fundamental wave component and a plurality of voltage harmonic components.

An A-phase voltage rotation vector can be separated into the following real and imaginary parts.

$$\left.\begin{array}{l} v_{Are}(t) = \sqrt{2}\, V_A \cos(\omega t + \varphi_A) + \sqrt{2}\sum_{k=1}^{M} V_{Ak}\cos(\omega_k t + \varphi_{Ak}) \\ v_{Aim}(t) = \sqrt{2}\, V_A \sin(\omega t + \varphi_A) + \sqrt{2}\sum_{k=1}^{M} v_{Ak}\sin(\omega_k t + \varphi_{Ak}) \end{array}\right\} \quad (6)$$

Similarly, a B-phase voltage rotation vector and its real and imaginary parts are expressed as follows:

$$v_B(t) = \sqrt{2}\, V_B e^{j(\omega t+\varphi_B)} + \sqrt{2}\sum_{k=1}^{M} V_{Bk} e^{j(\omega_k t+\varphi_{Bk})} \quad (7)$$

$$\left.\begin{array}{l} v_{Bre}(t) = \sqrt{2}\, V_B \cos(\omega t + \varphi_B) + \sqrt{2}\sum_{k=1}^{M} V_{Bk}\cos(\omega_k t + \varphi_{Bk}) \\ v_{Bim}(t) = \sqrt{2}\, V_B \sin(\omega t + \varphi_B) + \sqrt{2}\sum_{k=1}^{M} V_{Bk}\sin(\omega_k t + \varphi_{Bk}) \end{array}\right\} \quad (8)$$

A C-phase voltage rotation vector and its real and imaginary parts are expressed as follows:

$$v_C(t) = \sqrt{2}\, V_C e^{j(\omega t+\varphi_C)} + \sqrt{2}\sum_{k=1}^{M} V_{Ck} e^{j(\omega_k t+\varphi_{Ck})} \quad (9)$$

$$\left.\begin{array}{l} v_{Cre}(t) = \sqrt{2}\, V_C \cos(\omega t + \varphi_C) + \sqrt{2}\sum_{k=1}^{M} V_{Ck}\cos(\omega_k t + \varphi_{Ck}) \\ v_{Cim}(t) = \sqrt{2}\, V_C \sin(\omega t + \varphi_C) + \sqrt{2}\sum_{k=1}^{M} V_{Ck}\sin(\omega_k t + \varphi_{Ck}) \end{array}\right\} \quad (10)$$

Further, an A-phase current rotation vector and its real and imaginary parts are expressed, respectively, as follows:

$$i_A(t) = \sqrt{2}\, I_A e^{j(\omega t+\theta_A)} + \sqrt{2}\sum_{k=1}^{M} I_{Ak} e^{j(\omega_k t+\theta_{Ak})} \quad (11)$$

$$\left.\begin{array}{l} i_{Are}(t) = \sqrt{2}\, I_A \cos(\omega t + \theta_A) + \sqrt{2}\sum_{k=1}^{M} I_{Ak}\cos(\omega_k t + \theta_{Ak}) \\ i_{Aim}(t) = \sqrt{2}\, I_A \sin(\omega t + \theta_A) + \sqrt{2}\sum_{k=1}^{M} V_{Ak}\sin(\omega_k t + \theta_{Ak}) \end{array}\right\} \quad (12)$$

In the equation, $I_A$ represents an effective fundamental wave voltage; $\omega$ represents a fundamental wave angular velocity; $\theta_A$ represents a fundamental wave voltage initial phase; $I_{Ak}$ represents an effective k-th harmonic current; $\omega_k$ represents a k-th harmonic current angular velocity; $\theta_{Ak}$ represents a k-th harmonic current initial phase; and M represents an arbitrary positive integer. That is, an instantaneous current includes a current fundamental wave component and a plurality of current harmonic components.

Similarly, a B-phase current rotation vector and its real and imaginary parts are expressed, respectively, as follows:

$$i_B(t) = \sqrt{2}\, I_B e^{j(\omega t+\theta_B)} + \sqrt{2}\sum_{k=1}^{M} I_{Bk} e^{j(\omega_k t+\theta_{Bk})} \quad (13)$$

$$\left.\begin{array}{l} i_{Bre}(t) = \sqrt{2}\, I_B \cos(\omega t + \theta_B) + \sqrt{2}\sum_{k=1}^{M} I_{Bk}\cos(\omega_k t + \theta_{Bk}) \\ i_{Bim}(t) = \sqrt{2}\, I_B \sin(\omega t + \theta_B) + \sqrt{2}\sum_{k=1}^{M} V_{Bk}\sin(\omega_k t + \theta_{Bk}) \end{array}\right\} \quad (14)$$

A C-phase current rotation vector and its real and imaginary parts are expressed as, respectively, follows:

$$i_C(t) = \sqrt{2}\, I_C e^{j(\omega t+\theta_C)} + \sqrt{2}\sum_{k=1}^{M} I_{Ck} e^{j(\omega_k t+\theta_{Ck})} \quad (15)$$

$$\left.\begin{array}{l} i_{Cre}(t) = \sqrt{2}\, I_C \cos(\omega t + \theta_C) + \sqrt{2}\sum_{k=1}^{M} I_{Ck}\cos(\omega_k t + \theta_{Ck}) \\ i_{Cim}(t) = \sqrt{2}\, I_C \sin(\omega t + \theta_C) + \sqrt{2}\sum_{k=1}^{M} V_{Ck}\sin(\omega_k t + \theta_{Ck}) \end{array}\right\} \quad (16)$$

In the following equation expansion, $i_A$, $i_B$, and $i_C$ represent $i_{Are}$, $i_{Bre}$, and $i_{Cre}$, and $v_A$, $v_B$, and $v_C$ represent $v_{Are}$, $v_{Bre}$, and $v_{Cre}$ for the sake of simplicity. In the symmetrical component equation expansion, $i_0$, $i_1$, and $i_2$ represent $i_{0re}$, $i_{1re}$, and $i_{2re}$, and $v_0$, $v_1$, and $v_2$ represent $v_{0re}$, $v_{1re}$, and $v_{2re}$.

In the step 102, a realtime frequency is measured. A realtime frequency is calculated in accordance with the dynamic frequency measuring method proposed by the present inventor (see the equations (3) and (4) described above). Since the method is described in the prior application WO-PCT/JP2007/052967, detailed description thereof will be omitted to avoid redundancy.

In the step 103, estimated instantaneous voltage/current time-series data for each of the phase components are calculated. Estimated instantaneous voltage/current time-series data for each of the phase components are calculated in accordance with the least-squares method. A specific example of the calculation will be described below.

First, the fundamental wave component of an instantaneous A-phase voltage can be expressed by the following equation:

$$v_A(t) = \sqrt{2} V_A \cos(\omega t+\phi_A) = P_{vA1} \cos \omega t + P_{vA2} \sin \omega t \quad (17)$$

In the equation, $\omega$ represents an angular rotation velocity and is calculated as follows:

$$\omega = 2\pi f \quad (18)$$

In the equation, f represents a measured realtime frequency and is updated in every step.

The fundamental equation (17) is used to build the following matrix data:

$$[v_A]=[A][P_{vA}] \quad (19)$$

In the equation, the measured instantaneous A-phase voltage time-series data are expressed as follows:

The last data $v_{A24}$ is present measured data.

$$[v_A] = \begin{bmatrix} v_{A1} \\ v_{A2} \\ \vdots \\ v_{A24} \end{bmatrix} \quad (20)$$

The coefficient matrix in the estimation calculation is expressed as follows:

$$[A] = \begin{bmatrix} \cos\omega t_1 & \sin\omega t_1 \\ \cos\omega t_2 & \sin\omega t_2 \\ \vdots & \vdots \\ \cos\omega t_{24} & \sin\omega t_{24} \end{bmatrix} \quad (21)$$

The time is calculated by the following equation:

$$t_{k+1}=t_k+T, k=0,2,\ldots,23, t_0=0 \quad (22)$$

The fixed time increments are calculated as follows:

$$T = \frac{1}{4N}\frac{1}{f_0} = \frac{1}{12}\frac{1}{60} = 0.00138889 \text{ (seconds)} \quad (23)$$

The coefficient matrix is expressed as follows:

$$[P_{vA}] = \begin{bmatrix} P_{vA1} \\ P_{vA2} \end{bmatrix} \quad (24)$$

The coefficients are calculated in accordance with the least-squares method as follows:

$$[P_{vA}]=([A]^T[A])^{-1}[A]^T[v_A] \quad (25)$$

The estimated instantaneous A-phase voltage time-series data are calculated as follows:

$$v_{Aek}=P_{vA1}\cos\omega t_k+P_{vA2}\sin\omega t_k, k=1,2,\ldots,24 \quad (26)$$

In the equation, the time is expressed as follows:

$$t_{k+1}=t_k+T, k=0,2,\ldots,23, t_0=0 \quad (27)$$

The increments are changed online and calculated by using the measured frequency $f_1$ as follows:

$$T_1 = \frac{1}{4N}\frac{1}{f_1} = \frac{1}{12f_1} \text{ (seconds)} \quad (28)$$

The time-series data expressed by the equation (26) are estimated data created to calculate effective values. The same argument applies to the following equation expansion.

A measured B-phase voltage is expressed as follows in accordance with the same calculation method:

$$[v_B] = \begin{bmatrix} v_{B1} \\ v_{B2} \\ \vdots \\ v_{B24} \end{bmatrix} \quad (29)$$

Estimated instantaneous B-phase voltage time-series data are calculated as follows:

$$v_{Bek}=P_{vB1}\cos\omega t_k+P_{vB2}\sin\omega t_k, k=1,2,\ldots,24 \quad (30)$$

A measured C-phase voltage is expressed as follows in accordance with the same calculation method:

$$[v_C] = \begin{bmatrix} v_{C1} \\ v_{C2} \\ \vdots \\ v_{C24} \end{bmatrix} \quad (31)$$

Estimated instantaneous C-phase voltage time-series data are calculated as follows:

$$v_{Cek}=P_{vC1}\cos\omega t_k+P_{vC2}\sin\omega t_k, k=1,2,\ldots,24 \quad (32)$$

Next, estimated instantaneous A-phase current time-series data are determined.

An A-phase current is determined by the following equation:

$$i_A=\sqrt{2}I_A\cos(\omega t+\theta_A)=P_{iA1}\cos\omega t+P_{iA2}\sin\omega t \quad (33)$$

The following matrix is satisfied.

$$[i_A]=[A][P_{iA}] \quad (34)$$

Measured A-phase time-series data are expressed as follows. Present measured current data is $i_{A12}$.

$$[i_A] = \begin{bmatrix} i_{A1} \\ i_{A2} \\ \vdots \\ i_{A24} \end{bmatrix} \quad (35)$$

The coefficient matrix is expressed as follows:

$$[P_{iA}] = \begin{bmatrix} P_{iA1} \\ P_{iA2} \end{bmatrix} \quad (36)$$

The A-phase current coefficients are determined in accordance with the least-squares method.

$$[P_{iA}]=([A]^T[A])^{-1}[A]^T[i_A] \quad (37)$$

The instantaneous A-phase current time-series data are calculated as follows:

$$i_{Aek}=P_{iA1}\cos\omega t_k+P_{iA2}\sin\omega t_k, k=1,2,\ldots,24 \quad (38)$$

Measured instantaneous B-phase current time-series data are expressed as follows:

$$[i_B] = \begin{bmatrix} i_{B1} \\ i_{B2} \\ \vdots \\ i_{B24} \end{bmatrix} \quad (39)$$

Estimated instantaneous B-phase current time-series data are calculated as follows:

$$i_{Bek} = P_{iB1} \cos \omega t_k + P_{iB2} \sin \omega t_k, \, k=1,2,\ldots,24 \quad (40)$$

Measured instantaneous C-phase current time-series data are expressed as follows:

$$[i_C] = \begin{bmatrix} i_{C1} \\ i_{C2} \\ \vdots \\ i_{C24} \end{bmatrix} \quad (41)$$

Estimated instantaneous C-phase current time-series data are calculated as follows:

$$i_{Cek} = P_{iC1} \cos \omega t_k + P_{iC2} \sin \omega t_k, \, k=1,2,\ldots,24 \quad (42)$$

The estimated instantaneous voltage/current time-series data for each of the phases described above are complete sinusoidal data.

In the step 104, the estimated instantaneous voltage/current time-series data for each of the phases calculated in the step 103 are used to calculate estimated instantaneous voltage/current time-series data for symmetrical components.

In this process, the concept of the method of symmetrical coordinates is used to determine symmetrical components (zero-phase, positive-phase, and negative-phase). Since the estimated instantaneous voltage/current time-series data for each of the phases to be used are complete sinusoidal data (estimated instantaneous time-series data), the symmetrical components can be determined correctly in the following manner:

An instantaneous zero-phase voltage is calculated by the following equation:

$$v_{0ej} = \frac{1}{3}(v_{Aek} + v_{Bek} + v_{Cek}), \quad (43)$$
$$j = 1, 2, \ldots 16,$$
$$k = 9, 10, \ldots, 24$$

An instantaneous positive-phase voltage is calculated by the following equation:

$$v_{1ej} = \frac{1}{3}\{v_{Aek} + v_{Be(k-8)} + v_{Ce(k-4)}\}, \quad (44)$$
$$j = 1, 2, \ldots 16,$$
$$k = 9, 10, \ldots, 24$$

An instantaneous negative-phase voltage is calculated by the following equation:

$$v_{2ej} = \frac{1}{3}\{v_{Aek} + v_{Be(k-4)} + v_{Ce(k-8)}\}, \quad (45)$$
$$j = 1, 2, \ldots 16,$$
$$k = 9, 10, \ldots, 24$$

An instantaneous zero-phase current is calculated by the following equation:

$$i_{0ej} = \frac{1}{3}(i_{Aek} + i_{Bek} + i_{Cek}), \quad (46)$$
$$j = 1, 2, \ldots 16,$$
$$k = 9, 10, \ldots, 24$$

An instantaneous positive-phase current is calculated by the following equation:

$$i_{1ej} = \frac{1}{3}\{i_{Aek} + i_{Be(k-8)} + i_{Ce(k-4)}\}, \quad (47)$$
$$j = 1, 2, \ldots 16,$$
$$k = 9, 10, \ldots, 24$$

An instantaneous negative-phase current is calculated by the following equation:

$$i_{2ej} = \frac{1}{3}\{i_{Aek} + i_{Be(k-4)} + i_{Ce(k-8)}\}, \quad (48)$$
$$j = 1, 2, \ldots 16,$$
$$k = 9, 10, \ldots, 24$$

Unlike the method of symmetrical coordinates for instantaneous values of related art, a positive-phase voltage is not conjugate to the corresponding negative-phase voltage, and a positive-phase current is not conjugate to the corresponding negative-phase current.

In the step 105, present effective voltage/current of each of the phase components are calculated. An effective A-phase voltage is calculated by the following equation:

$$V_A(t) = \sqrt{\frac{1}{T_0} \int_{-T_0}^{0} v_{Ae}^2 dt} = \sqrt{\frac{1}{12} \sum_{k=13}^{24} v_{Aek}^2} \quad (49)$$

A running average is calculated. In the invention, a running average is calculated for a one-cycle sampling period. It is noted that a longer sampling period provides more stable data.

$$V_{Aave}(t) = \frac{1}{12} \sum_{k=0}^{11} V_A(t - kT) \quad (50)$$

An effective B-phase voltage is calculated by the following equation:

$$V_B(t) = \sqrt{\frac{1}{T_0}\int_{-T_0}^{0} v_{Be}^2 dt} = \sqrt{\frac{1}{12}\sum_{k=13}^{24} v_{Bek}^2} \tag{51}$$

A running average is calculated.

$$V_{Bave}(t) = \frac{1}{12}\sum_{k=0}^{11} V_B(t-kT) \tag{52}$$

An effective C-phase voltage is calculated by the following equation:

$$V_C(t) = \sqrt{\frac{1}{T_0}\int_{-T_0}^{0} v_{ce}^2 dt} = \sqrt{\frac{1}{12}\sum_{k=13}^{24} v_{Cek}^2} \tag{53}$$

A running average is calculated.

$$V_{Cave}(t) = \frac{1}{12}\sum_{k=0}^{11} V_C(t-kT) \tag{54}$$

An effective A-phase current is calculated by the following equation:

$$I_A(t) = \sqrt{\frac{1}{T_0}\int_{-T_0}^{0} i_{Ae}^2 dt} = \sqrt{\frac{1}{12}\sum_{k=13}^{24} i_{Aek}^2} \tag{55}$$

A running average is calculated.

$$I_{Aave}(t) = \frac{1}{12}\sum_{k=0}^{11} I_A(t-kT) \tag{56}$$

An effective B-phase current is calculated by the following equation:

$$I_B(t) = \sqrt{\frac{1}{T_0}\int_{-T_0}^{0} i_{Be}^2 dt} = \sqrt{\frac{1}{12}\sum_{k=13}^{24} i_{Bek}^2} \tag{57}$$

A running average is calculated.

$$I_{Bave}(t) = \frac{1}{12}\sum_{k=0}^{11} I_B(t-kT) \tag{58}$$

An effective C-phase current is calculated by the following equation:

$$I_C(t) = \sqrt{\frac{1}{T_0}\int_{-T_0}^{0} i_{Ce}^2 dt} = \sqrt{\frac{1}{12}\sum_{k=13}^{24} i_{Cek}^2} \tag{59}$$

A running average is calculated.

$$I_{Cave}(t) = \frac{1}{12}\sum_{k=0}^{11} I_C(t-kT) \tag{60}$$

In the step 106, present effective voltage/current of each of the symmetrical components are calculated. An effective zero-phase voltage is calculated by the following equation:

$$V_0(t) = \sqrt{\frac{1}{T_0}\int_{-T_0}^{0} v_{0e}^2 dt} = \sqrt{\frac{1}{12}\sum_{k=5}^{16} v_{0ek}^2} \tag{61}$$

A running average is calculated.

$$V_{0ave}(t) = \frac{1}{12}\sum_{k=0}^{11} V_0(t-kT) \tag{62}$$

An effective positive-phase voltage is calculated by the following equation:

$$V_1(t) = \sqrt{\frac{1}{T_0}\int_{-T_0}^{0} v_{1e}^2 dt} = \sqrt{\frac{1}{12}\sum_{k=5}^{16} v_{1ek}^2} \tag{63}$$

A running average is calculated.

$$V_{1ave}(t) = \frac{1}{12}\sum_{k=0}^{11} V_1(t-kT) \tag{64}$$

An effective negative-phase voltage is calculated by the following equation:

$$V_2(t) = \sqrt{\frac{1}{T_0}\int_{-T_0}^{0} v_{2e}^2 dt} = \sqrt{\frac{1}{12}\sum_{k=5}^{16} v_{2ek}^2} \tag{65}$$

A running average is calculated.

$$V_{2ave}(t) = \frac{1}{12}\sum_{k=0}^{11} V_2(t-kT) \tag{66}$$

An effective zero-phase current is calculated by the following equation:

$$I_0(t) = \sqrt{\frac{1}{T_0}\int_{-T_0}^{0} i_{0e}^2 dt} = \sqrt{\frac{1}{12}\sum_{k=5}^{16} i_{0ek}^2} \tag{67}$$

A running average is calculated.

$$I_{0ave}(t) = \frac{1}{12}\sum_{k=0}^{11} I_0(t-kT) \qquad (68)$$

An effective positive-phase current is calculated by the following equation:

$$I_1(t) = \sqrt{\frac{1}{T_0}\int_{-T_0}^{0} \hat{i}_{1e}^2 \, dt} = \sqrt{\frac{1}{12}\sum_{k=5}^{16} \hat{i}_{1ek}^2} \qquad (69)$$

A running average is calculated.

$$I_{1ave}(t) = \frac{1}{12}\sum_{k=0}^{11} I_1(t-kT) \qquad (70)$$

An effective negative-phase current is calculated by the following equation:

$$I_2(t) = \sqrt{\frac{1}{T_0}\int_{-T_0}^{0} \hat{i}_{2e}^2 \, dt} = \sqrt{\frac{1}{12}\sum_{k=5}^{16} \hat{i}_{2ek}^2} \qquad (71)$$

A running average is calculated.

$$I_{2ave}(t) = \frac{1}{12}\sum_{k=0}^{11} I_2(t-kT) \qquad (72)$$

In the step 107, estimated instantaneous active electric power/reactive electric power time-series data for each of the phase components are calculated.

Estimated instantaneous A-phase active electric power time-series data are calculated by the following equation:

$$p_{Ai}=v_{Aej} \cdot i_{Aej},\ i=1,2,\ldots,12, j=13,14,\ldots,24 \qquad (73)$$

Estimated instantaneous B-phase active electric power time-series data are calculated by the following equation:

$$p_{Bi}=v_{Bej} \cdot i_{Bej},\ i=1,2,\ldots,12, j=13,14,\ldots,24 \qquad (74)$$

Estimated instantaneous C-phase active electric power time-series data are calculated by the following equation:

$$p_{Ci}=v_{Cej} \cdot i_{Cej},\ i=1,2,\ldots,12, j=13,14,\ldots,24 \qquad (75)$$

Estimated instantaneous A-phase reactive electric power time-series data are calculated by the following equation:

$$q_{Ai}=v_{Ae(j-3)} \cdot i_{Aej},\ i=1,2,\ldots,12, j=13,14,\ldots,24 \qquad (76)$$

Estimated instantaneous B-phase reactive electric power time-series data are calculated by the following equation:

$$q_{Bi}=v_{Be(j-3)} \cdot i_{Bej},\ i=1,2,\ldots,12, j=13,14,\ldots,24 \qquad (77)$$

Estimated instantaneous C-phase reactive electric power time-series data are calculated by the following equation:

$$q_{Ci}=v_{Ce(j-3)} \cdot i_{Cej},\ i=1,2,\ldots,12, j=13,14,\ldots,24 \qquad (78)$$

In the step 108, estimated instantaneous active electric power/reactive electric power time-series data for each of the symmetrical components are calculated.

Estimated instantaneous zero-phase active electric power time-series data are calculated by the following equation:

$$p_{0i}=v_{0ej} \cdot i_{0ej},\ i=1,2,\ldots,12, j=5,6,\ldots,16 \qquad (79)$$

Estimated instantaneous positive-phase active electric power time-series data are calculated by the following equation:

$$p_{1i}=v_{1ej} \cdot i_{1ej},\ i=1,2,\ldots,12, j=5,6,\ldots,16 \qquad (80)$$

Estimated instantaneous negative-phase active electric power time-series data are calculated by the following equation:

$$p_{2i}=v_{2ej} \cdot i_{2ej},\ i=1,2,\ldots,12, j=5,6,\ldots,16 \qquad (81)$$

Estimated instantaneous zero-phase reactive electric power time-series data are calculated by the following equation:

$$q_{0i}=v_{0e(j-3)} \cdot i_{0ej},\ i=1,2,\ldots,12, j=5,6,\ldots,16 \qquad (82)$$

Estimated instantaneous positive-phase reactive electric power time-series data are calculated by the following equation:

$$q_{1i}=v_{1e(j-3)} \cdot i_{1ej},\ i=1,2,\ldots,12, j=5,6,\ldots,16 \qquad (83)$$

Estimated instantaneous negative-phase reactive electric power time-series data are calculated by the following equation:

$$q_{2i}=v_{2e(j-3)} \cdot i_{2ej},\ i=1,2,\ldots,12, j=5,6,\ldots,16 \qquad (84)$$

In the step 109, present effective active electric power/reactive electric power of each of the phase components are calculated.

An effective A-phase active electric power is calculated by the following equation:

$$P_A(t) = \frac{1}{T_0}\int_{-T_0}^{0} p_A \, dt = \frac{1}{12} \cdot \sum_{k=1}^{12} p_{Ak} \qquad (85)$$

A running average is calculated.

$$P_{Aave}(t) = \frac{1}{12}\sum_{k=0}^{11} P_A(t-kT) \qquad (86)$$

An effective B-phase active electric power is calculated by the following equation:

$$P_B(t) = \frac{1}{T_0}\int_{-T_0}^{0} p_B \, dt = \frac{1}{12} \cdot \sum_{k=1}^{12} p_{Bk} \qquad (87)$$

A running average is calculated.

$$P_{Bave}(t) = \frac{1}{12}\sum_{k=0}^{11} P_B(t-kT) \qquad (88)$$

An effective C-phase active electric power is calculated by the following equation:

$$P_C(t) = \frac{1}{T_0}\int_{-T_0}^{0} p_C dt = \frac{1}{12}\cdot\sum_{k=1}^{12} p_{Ck} \tag{89}$$

A running average is calculated.

$$P_{Cave}(t) = \frac{1}{12}\sum_{k=0}^{11} P_C(t-kT) \tag{90}$$

An effective three-phase active electric power is calculated by the following equation:

$$P_3(t) = P_A(t) + P_B(t) + P_C(t) \tag{91}$$

An effective A-phase reactive electric power is calculated by the following equation:

$$Q_A(t) = \frac{1}{T_0}\int_{-T_0}^{0} q_A dt = \frac{1}{12}\cdot\sum_{k=1}^{12} q_{Ak} \tag{92}$$

A running average is calculated.

$$Q_{Aave}(t) = \frac{1}{12}\sum_{k=0}^{11} Q_A(t-kT) \tag{93}$$

An effective B-phase reactive electric power is calculated by the following equation:

$$Q_B(t) = \frac{1}{T_0}\int_{-T_0}^{0} q_B dt = \frac{1}{12}\cdot\sum_{k=1}^{12} q_{Bk} \tag{94}$$

A running average is calculated.

$$Q_{Bave}(t) = \frac{1}{12}\sum_{k=0}^{11} Q_B(t-kT) \tag{95}$$

An effective C-phase reactive electric power is calculated by the following equation:

$$Q_C(t) = \frac{1}{T_0}\int_{-T_0}^{0} q_C dt = \frac{1}{12}\cdot\sum_{k=1}^{12} q_{Ck} \tag{96}$$

A running average is calculated.

$$Q_{Cave}(t) = \frac{1}{12}\sum_{k=0}^{11} Q_C(t-kT) \tag{97}$$

An effective three-phase reactive electric power is calculated by the following equation:

$$Q_3(t) = Q_A(t) + Q_B(t) + Q_C(t) \tag{98}$$

In the step 110, present effective active electric power/reactive electric power of each of the symmetrical components are calculated.

An effective zero-phase active electric power is calculated by the following equation:

$$P_0(t) = \frac{1}{T_0}\int_{-T_0}^{0} p_0 dt = \frac{1}{12}\cdot\sum_{k=1}^{12} p_{0k} \tag{99}$$

A running average is calculated.

$$P_{0ave}(t) = \frac{1}{12}\sum_{k=0}^{11} P_0(t-kT) \tag{100}$$

An effective positive-phase active electric power is calculated by the following equation:

$$P_1(t) = \frac{1}{T_0}\int_{-T_0}^{0} p_1 dt = \frac{1}{12}\cdot\sum_{k=1}^{12} p_{1k} \tag{101}$$

A running average is calculated.

$$P_{1ave}(t) = \frac{1}{12}\sum_{k=0}^{11} P_1(t-kT) \tag{102}$$

An effective negative-phase active electric power is calculated by the following equation:

$$P_2(t) = \frac{1}{T_0}\int_{-T_0}^{0} p_2 dt = \frac{1}{12}\cdot\sum_{k=1}^{12} p_{2k} \tag{103}$$

A running average is calculated.

$$P_{2ave}(t) = \frac{1}{12}\sum_{k=0}^{11} P_2(t-kT) \tag{104}$$

An effective zero-phase reactive electric power is calculated by the following equation:

$$Q_0(t) = \frac{1}{T_0}\int_{-T_0}^{0} q_0 dt = \frac{1}{12}\cdot\sum_{k=1}^{12} q_{0k} \tag{105}$$

A running average is calculated.

$$Q_{0ave}(t) = \frac{1}{12}\sum_{k=0}^{11} Q_0(t-kT) \tag{106}$$

An effective positive-phase reactive electric power is calculated by the following equation:

$$Q_1(t) = \frac{1}{T_0} \int_{-T_0}^{0} q_1 dt = \frac{1}{12} \cdot \sum_{k=1}^{12} q_{1k} \tag{107}$$

A running average is calculated.

$$Q_{1ave}(t) = \frac{1}{12} \sum_{k=0}^{11} Q_1(t - kT) \tag{108}$$

An effective negative-phase reactive electric power is calculated by the following equation:

$$Q_2(t) = \frac{1}{T_0} \int_{-T_0}^{0} q_2 dt = \frac{1}{12} \cdot \sum_{k=1}^{12} q_{2k} \tag{109}$$

A running average is calculated.

$$Q_{2ave}(t) = \frac{1}{12} \sum_{k=0}^{11} Q_2(t - kT) \tag{110}$$

In the step 111, a present phase angle between the voltage and current of each of the phase components is calculated.

A phase angle between A-phase voltage and current is calculated by the following equation:

$$\beta_A(t) = \tan^{-1}\left(\frac{Q_A}{P_A}\right) \tag{111}$$

The following calculating equation provides the same calculation result.

$$\beta_A(t) = \cos^{-1}\left(\frac{P_A}{I_A V_A}\right) = \cos^{-1}\left(\frac{P_A}{\sqrt{P_A^2 + Q_A^2}}\right) \tag{112}$$

A phase angle between B-phase voltage and current is calculated by the following equation:

$$\beta_B(t) = \tan^{-1}\left(\frac{Q_B}{P_B}\right) \tag{113}$$

The following calculating equation provides the same calculation result.

$$\beta_B(t) = \cos^{-1}\left(\frac{P_B}{I_B V_B}\right) = \cos^{-1}\left(\frac{P_B}{\sqrt{P_B^2 + Q_B^2}}\right) \tag{114}$$

A phase angle between C-phase voltage and current is calculated by the following equation:

$$\beta_C(t) = \tan^{-1}\left(\frac{Q_C}{P_C}\right) \tag{115}$$

The following calculating equation provides the same calculation result.

$$\beta_C(t) = \cos^{-1}\left(\frac{P_C}{I_C V_C}\right) = \cos^{-1}\left(\frac{P_C}{\sqrt{P_C^2 + Q_C^2}}\right) \tag{116}$$

In the step 112, a present phase angle between the voltage and current of each of the symmetrical components is calculated.

A phase angle between zero-phase voltage and current is calculated by the following equation:

$$\alpha_0(t) = \tan^{-1}\left(\frac{Q_0}{P_0}\right) \tag{117}$$

The following calculating equation provides the same calculation result.

$$\beta_0(t) = \cos^{-1}\left(\frac{P_0}{I_0 V_0}\right) = \cos^{-1}\left(\frac{P_0}{\sqrt{P_0^2 + Q_0^2}}\right) \tag{118}$$

A phase angle between positive-phase voltage and current is calculated by the following equation:

$$\alpha_1(t) = \tan^{-1}\left(\frac{Q_1}{P_1}\right) \tag{119}$$

The following calculating equation provides the same calculation result.

$$\beta_1(t) = \cos^{-1}\left(\frac{P_1}{I_1 V_1}\right) = \cos^{-1}\left(\frac{P_1}{\sqrt{P_1^2 + Q_1^2}}\right) \tag{120}$$

A phase angle between negative-phase voltage and current is calculated by the following equation:

$$\alpha_2(t) = \tan^{-1}\left(\frac{Q_2}{P_2}\right) \tag{121}$$

The following calculating equation provides the same calculation result.

$$\beta_2(t) = \cos^{-1}\left(\frac{P_2}{I_2 V_2}\right) = \cos^{-1}\left(\frac{P_2}{\sqrt{P_2^2 + Q_2^2}}\right) \tag{122}$$

Finally, it is judged in the step 113 whether or not the process is terminated. When the process is not terminated, the control returns to the step 101.

FIG. 4 shows a model system diagram for a three-phase electric power system, and Table 1 shows model circuit parameters of an AC electric quantity measuring device. That is, the design frequency is 60 Hz; the sampling increments are an electrical angle of 30 degrees or T=0.001388888 seconds; the input impedance Z1 is 1+j10Ω; the input frequency is 63 Hz; the effective A-phase voltage is 110 V and the A-phase initial phase angle is zero degrees; the effective B-phase voltage is 55 V and the B-phase initial phase angle is −120 degrees; and the effective C-phase voltage is 110 V and the C-phase initial phase angle is 120 degrees. In the model system diagram, the circuit is a three-phase unbalanced circuit and the input frequency differs from the design frequency.

According to the stationary-state AC theory, a current phasor can be determined by the following calculating equation:

$$\begin{bmatrix} \dot{I}_A \\ \dot{I}_B \\ \dot{I}_C \end{bmatrix} = \begin{bmatrix} Z_1 & 0 & 0 \\ 0 & Z_1 & 0 \\ 0 & 0 & Z_1 \end{bmatrix}^{-1} \begin{bmatrix} \dot{V}_A \\ \dot{V}_B \\ \dot{V}_C \end{bmatrix} \quad (123)$$

In the equation, $\dot{I}_A$, $\dot{I}_B$, and $\dot{I}_C$ represent A-phase, B-phase, and C-phase current phasors, respectively, and $\dot{V}_A$, $\dot{V}_B$, and $\dot{V}_C$ represent A-phase, B-phase, and C-phase voltage phasors, respectively.

The absolute value of the current phasor of each of the phase components is the effective current of the phase component, and the absolute value of the voltage phasor of each of the phase components is the effective voltage of the phase component.

Therefore, effective A-phase active electric power and reactive electric power can be calculated as follows:

$$P_A + jQ_A = \dot{V}_A \dot{I}_A^* \quad (124)$$

In the equation, $P_A$ and $Q_A$ represent effective A-phase active electric power and reactive electric power; $\dot{V}_A$ represents the A-phase voltage phasor; and $\dot{I}_A^*$ represents the conjugate A-phase current phasor.

B-phase and C-phase voltages can be similarly calculated.

Voltages of the symmetrical components are calculated in accordance with the method of symmetrical coordinates as follows:

$$\begin{bmatrix} \dot{V}_0 \\ \dot{V}_1 \\ \dot{V}_2 \end{bmatrix} = \frac{1}{3} \begin{bmatrix} 1 & 1 & 1 \\ 1 & \alpha & \alpha^2 \\ 1 & \alpha^2 & \alpha \end{bmatrix} \begin{bmatrix} \dot{V}_A \\ \dot{V}_B \\ \dot{V}_C \end{bmatrix} \quad (125)$$

In the equation, $\dot{V}_0$, $\dot{V}_1$, and $\dot{V}_2$ represent zero-phase, positive-phase, and negative-phase voltage phasors, respectively.

The absolute value of the voltage phasor of each of the symmetrical components is the effective voltage of the symmetrical component.

Currents of the symmetrical components are calculated in accordance with the method of symmetrical coordinates as follows:

$$\begin{bmatrix} \dot{I}_0 \\ \dot{I}_1 \\ \dot{I}_2 \end{bmatrix} = \frac{1}{3} \begin{bmatrix} 1 & 1 & 1 \\ 1 & \alpha & \alpha^2 \\ 1 & \alpha^2 & \alpha \end{bmatrix} \begin{bmatrix} \dot{I}_A \\ \dot{I}_B \\ \dot{I}_C \end{bmatrix} \quad (126)$$

In the equation, $\dot{I}_0$, $\dot{I}_1$, and $\dot{I}_2$ represent zero-phase, positive-phase, and negative-phase current phasors, respectively.

The absolute value of the current phasor of each of the symmetrical components is the effective current of the symmetrical component.

The conversion coefficients in the method of symmetrical coordinates are defined as follows:

$$\alpha = e^{j2\pi/3}, \alpha = e^{-j2\pi/3} \quad (127)$$

Effective positive-phase active electric power value and reactive electric power are calculated as follows:

$$P_1 + jQ_1 = \dot{V}_1 \dot{I}_1^* \quad (128)$$

In the equation, $P_1$ and $Q_1$ represent effective positive-phase active electric power and reactive electric power, respectively; $\dot{V}_1$ represents the positive-phase voltage phasor; and $\dot{I}_1^*$ represents the conjugate positive-phase current phasor.

Effective negative-phase active electric power and reactive electric power are calculated as follows:

$$P_2 + jQ_2 = \dot{V}_2 \dot{I}_2^* \quad (129)$$

In the equation, $P_2$ and $Q_2$ represent effective negative-phase active electric power and reactive electric power, respectively; $\dot{V}_2$ represents the negative-phase voltage phasor; and $\dot{I}_2^*$ represents the conjugate negative-phase current phasor.

Effective zero-phase active electric power and reactive electric power are calculated as follows:

$$P_0 + jQ_0 = \dot{V}_0 \dot{I}_0^* \quad (130)$$

In the equation, $P_0$ and $Q_0$ represent effective zero-phase active electric power and reactive electric power, respectively; $\dot{V}_0$ represents the zero-phase voltage phasor; and $\dot{I}_0^*$ represents the conjugate zero-phase current phasor.

Simulation results of the invention will be considered.

FIGS. 5 and 6 show measured instantaneous and effective, A-phase and B-Phase voltage/current waveforms in the presence of phase variation (voltage flickering). Although the input frequency (63 Hz) differs from the design frequency (60 Hz), the comparison of the above measured results with the calculated results obtained from the phasor computing equation (123) in a normal state shows that the two results perfectly agree with each other. It is therefore ascertained that the effective voltage/current of each phase component have been correctly measured without any error.

FIGS. 7 and 8 show measured instantaneous A-phase active electric power/reactive electric power and effective active electric power/reactive electric power waveforms in the presence of phase variation (voltage flickering). Although the input frequency differs from the design frequency, the comparison of the above measured results with the calculated results obtained from the phasor computing equation (124) in a normal state shows that the two results perfectly agree with each other. It is therefore ascertained that the effective active electric power/reactive electric power of each phase component have been correctly measured without any error.

FIGS. 9 and 10 show measured instantaneous and effective, positive-phase and negative-phase voltage/current waveforms in the presence of phase variation (voltage flickering). Although the input frequency differs from the design frequency, the comparison of the above measured results with the calculated results obtained from the phasor computing equation (125) in a normal state shows that the two results perfectly agree with each other. It is therefore ascertained that the effective voltage/current of each symmetrical component have been correctly measured without any error.

FIGS. 11 and 12 show measured instantaneous and effective zero-phase voltage/current waveforms in the presence of phase variation (voltage flickering). Although the input frequency differs from the design frequency, the comparison of the above measured results with the calculated results obtained from the phasor computing equation (126) in a normal state shows that the two results perfectly agree with each other. It is therefore ascertained that the effective voltage/current of each symmetrical component have been correctly measured without any error.

Finally, FIGS. 13 to 18 show measured instantaneous and effective active electric power/reactive electric power waveforms of each symmetrical component in the presence of phase variation (voltage flickering). Although the input frequency differs from the design frequency, the comparison of the above measured results with the calculated results obtained from the phasor computing equations (128), (129), and (130) in a normal state shows that the two results perfectly agree with each other. It is therefore ascertained that the effective active electric power/reactive electric power of each symmetrical component have been correctly measured without any error.

TABLE 1

Model circuit parameters

| | |
|---|---|
| Nominal frequency | 60 Hz |
| Sampling increments | Electrical angle 30 degrees, T = 0.001388888 seconds |
| Impedance $Z_1$ | $1 + j10$ (Ω) |
| Input frequency | 63 Hz |
| Effective A-phase voltage, Initial phase angle | 110 V, 0 degrees |
| Effective B-phase voltage, Initial phase angle | 55 V, −120 degrees |
| Effective C-phase voltage, Initial phase angle | 110 V, 120 degrees |

As another example of the AC electric quantity measuring device described above, the calculated present effective active electric power/reactive electric power of the phase components can be used to calculate present power factors of the symmetrical components in accordance with the following calculating equation: (effective active electric power/SQRT(effective active electric power2+effective reactive electric power2)).

The invention claimed is:

1. An AC electric quantity measuring device comprising:
   voltage/current measurement means for measuring time-series data on the voltage/current of a system;
   frequency calculation means for calculating a realtime frequency by determining the amplitude, the chord length, and the rotation phase angle of a voltage rotation vector by performing integral computation on the time-series data obtained by the voltage/current measurement means and determining the rate of change in frequency per step; and
   estimated instantaneous phase-component voltage/current time-series data calculation means for calculating estimated instantaneous sinusoidal voltage/current time-series data for each phase component in accordance with the least-squares method by using the realtime frequency and the instantaneous voltage/current time-series data for the phase component,
   wherein the sampling increments in which the instantaneous voltage/current time-series data are measured are set to a fixed frequency, and
   the sampling increments in which the instantaneous voltage/current time-series data for each phase component are estimated are set to a measured frequency.

2. The AC electric quantity measuring device according to claim 1, wherein the AC electric quantity measuring device further comprises estimated instantaneous symmetrical-component voltage/current time-series data calculation means for calculating estimated instantaneous voltage/current time-series data for symmetrical components (zero-phase, positive-phase, and negative-phase) in accordance with the method of symmetrical coordinates by using the estimated instantaneous voltage/current time-series data for the phase components that have been calculated.

3. The AC electric quantity measuring device according to claim 1, wherein the AC electric quantity measuring device further comprises effective phase-component voltage/current calculation means for calculating present effective voltage/current of each phase component by performing running averaging on the estimated instantaneous voltage/current time-series data for the phase component that have been calculated.

4. The AC electric quantity measuring device according to claim 2, wherein the AC electric quantity measuring device further comprises effective symmetrical-component voltage/current calculation means for calculating present effective voltage/current of symmetrical components by performing running averaging on the estimated instantaneous voltage/current time-series data for symmetrical components that have been calculated.

5. The AC electric quantity measuring device according to claim 1, wherein the AC electric quantity measuring device further comprises estimated instantaneous phase-component active electric power/reactive electric power time-series data calculation means for calculating estimated instantaneous active electric power/reactive electric power time-series data for each phase component by using the estimated instantaneous voltage time-series data for the phase component and estimated instantaneous current time-series data for the phase component that have been calculated.

6. The AC electric quantity measuring device according to claim 2, wherein the AC electric quantity measuring device further comprises estimated instantaneous symmetrical-component active electric power/reactive electric power time-series data calculation means for calculating estimated instantaneous active electric power/reactive electric power time-series data for symmetrical components by using the estimated instantaneous voltage time-series data for symmetrical components and estimated instantaneous current time-series data for symmetrical components that have been calculated.

7. The AC electric quantity measuring device according to claim 5, wherein the AC electric quantity measuring device further comprises present effective phase-component active electric power/reactive electric power calculation means for calculating present effective active electric power/reactive electric power of each phase component by performing integral computation and running averaging on the estimated instantaneous active electric power/reactive electric power time-series data for the phase component that have been calculated.

8. The AC electric quantity measuring device according to claim 6, wherein the AC electric quantity measuring device further comprises present effective symmetrical-component active electric power/reactive electric power calculation means for calculating present effective active electric power/reactive electric power of symmetrical components by performing integral computation and running averaging on the estimated instantaneous active electric power/reactive electric power time-series data for symmetrical components that have been calculated.

9. The AC electric quantity measuring device according to claim 7, wherein the AC electric quantity measuring device further comprises present phase-component voltage-current phase angle calculation means for calculating the present phase angle between the voltage and current of each phase component by using the present effective active electric power/reactive electric power of the phase component or present effective voltage/current of the phase component that have been calculated.

10. The AC electric quantity measuring device according to claim 7, wherein the AC electric quantity measuring device further comprises present symmetrical-component voltage-current phase angle calculation means for calculating the present phase angle between the voltage and current of symmetrical components by using the present effective active electric power/reactive electric power of symmetrical components or present effective voltage/current of symmetrical components that have been calculated.

11. The AC electric quantity measuring device according to claim 7, wherein the AC electric quantity measuring device further comprises means for calculating present power factors for symmetrical components by using the present effective active electric power/reactive electric power of the phase components that have been calculated.

* * * * *